United States Patent
Connor et al.

(10) Patent No.: US 11,146,288 B2
(45) Date of Patent: Oct. 12, 2021

(54) TECHNOLOGIES FOR APPLYING A REDUNDANCY ENCODING SCHEME TO SEGMENTED NETWORK PACKETS

(71) Applicant: Intel Corporation, Santa Clara, CA (US)

(72) Inventors: Patrick Connor, Beaverton, OR (US); Kapil Sood, Portland, OR (US); Scott Dubal, Oregon City, OR (US); Andrew Herdrich, Hillsboro, OR (US); James Hearn, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 16/815,666

(22) Filed: Mar. 11, 2020

(65) Prior Publication Data

US 2020/0280324 A1    Sep. 3, 2020

Related U.S. Application Data

(63) Continuation of application No. 15/720,400, filed on Sep. 29, 2017, now Pat. No. 10,630,315.

(51) Int. Cl.
*H03M 13/09* (2006.01)
*H03M 13/29* (2006.01)
(Continued)

(52) U.S. Cl.
CPC ....... *H03M 13/093* (2013.01); *H03M 13/091* (2013.01); *H03M 13/251* (2013.01);
(Continued)

(58) Field of Classification Search
CPC ............. H03M 13/093; H03M 13/091; H03M 13/251; H03M 13/29; H03M 13/373; H04L 1/00
See application file for complete search history.

(56) References Cited

U.S. PATENT DOCUMENTS 6,654,921 B1    11/2003    Jones et al.
6,694,478 B1    2/2004    Martinian et al.
(Continued)

OTHER PUBLICATIONS

United States Patent and Trademark Office, "Non-Final Office Action," issued in connection with U.S. Appl. No. 15/720,400, dated Sep. 26, 2018, 36 pages.
(Continued)

*Primary Examiner* — Kyle Vallecillo
(74) *Attorney, Agent, or Firm* — Hanley, Flight & Zimmerman, LLC

(57) ABSTRACT

Technologies for applying a redundancy encoding scheme to segmented portions of a data block include an endpoint computing device communicatively coupled to a destination computing device. The endpoint computing device is configured to divide a block of data into a plurality of data segments as a function of a transmit window size and a redundancy encoding scheme, and generate redundant data usable to reconstruct each of the plurality of data segments. The endpoint computing device is additionally configured to format a series of network packets that each includes a data segment of the plurality of data segments and generated redundant data for at least one other data segment of the plurality of data segments. Further, the endpoint computing device is configured to transport each of the series of network packets to a destination computing device. Other embodiments are described herein.

24 Claims, 9 Drawing Sheets

(51) Int. Cl.
  *H03M 13/25*  (2006.01)
  *H03M 13/37*  (2006.01)
  *H04L 1/00*  (2006.01)

(52) U.S. Cl.
  CPC ......... *H03M 13/29* (2013.01); *H03M 13/373* (2013.01); *H04L 1/00* (2013.01)

(56) References Cited

U.S. PATENT DOCUMENTS

| | | | |
|---|---|---|---|
| 10,630,315 B2 | 4/2020 | Connor et al. | |
| 2002/0146074 A1 | 10/2002 | Ariel et al. | |
| 2002/0157058 A1 | 10/2002 | Ariel et al. | |
| 2004/0049698 A1 | 3/2004 | Ott et al. | |
| 2007/0104225 A1* | 5/2007 | Mizuochi | H03M 13/2707 370/476 |
| 2008/0018235 A1* | 1/2008 | Wang | C09K 11/7734 313/503 |
| 2008/0244120 A1* | 10/2008 | Park | G06F 13/385 710/65 |
| 2009/0067424 A1* | 3/2009 | Zhang | H04L 1/1607 370/389 |
| 2011/0087948 A1 | 4/2011 | Murakami et al. | |
| 2011/0261813 A1* | 10/2011 | Baptist | G06F 3/065 370/389 |
| 2011/0283162 A1 | 11/2011 | Murakami | |
| 2013/0275656 A1* | 10/2013 | Talagala | G06F 12/0246 711/103 |
| 2013/0290814 A1 | 10/2013 | Hwang et al. | |
| 2013/0304711 A1* | 11/2013 | Resch | G06F 21/6218 707/690 |
| 2014/0052706 A1* | 2/2014 | Misra | G06F 3/0613 707/698 |
| 2014/0136921 A1 | 5/2014 | Murakami | |
| 2015/0288386 A1 | 10/2015 | Murakami | |
| 2016/0011939 A1 | 1/2016 | Luby | |
| 2017/0033806 A1 | 2/2017 | Arslan et al. | |
| 2017/0244648 A1* | 8/2017 | Tse | H04L 47/28 |
| 2017/0339038 A1* | 11/2017 | Everett | H04L 1/0071 |
| 2018/0026746 A1* | 1/2018 | Bruhn | H04L 1/0045 714/746 |
| 2019/0220356 A1* | 7/2019 | Zhang | G06F 3/0619 |
| 2020/0034339 A1* | 1/2020 | Gershaneck | G06F 16/162 |

OTHER PUBLICATIONS

United States Patent and Trademark Office, "Final Office Action," issued in connection with U.S. Appl. No. 15/720,400, dated May 17, 2019, 31 pages.

United States Patent and Trademark Office, "Advisory Action," issued in connection with U.S. Appl. No. 15/720,400, dated Jul. 29, 2019, 3 pages.

United States Patent and Trademark Office, "Non-Final Office Action," issued in connection with U.S. Appl. No. 15/720,400, dated Aug. 22, 2019, 33 pages.

United States Patent and Trademark Office, "Notice of Allowance and Fee(s) Due," issued in connection with U.S. Appl. No. 15/720,400, dated Dec. 18, 2019, 6 pages.

Cha et al., "Improving packet header compression with adaptive sliding window size," 2015 International Conference on Information Networking (ICOI N), Conference Location: Cambodia, Cambodia, Date of Conference: Jan. 12-14, 2015, pp. 541-543. (Year: 2015).

\* cited by examiner

TECHNOLOGIES FOR APPLYING A REDUNDANCY ENCODING SCHEME TO SEGMENTED NETWORK PACKETS

CROSS-REFERENCE TO RELATED APPLICATION

The present application is a continuation application of U.S. application Ser. No. 15/720,400, entitled "TECHNOLOGIES FOR APPLYING A REDUNDANCY ENCODING SCHEME TO SEGMENTED NETWORK PACKETS," which was filed on Sep. 29, 2017.

BACKGROUND

Modern computing devices have become ubiquitous tools for personal, business, and social uses. As such, many modern computing devices are capable of connecting to various data networks, including the Internet, to transmit and receive data communications over the various data networks at varying rates of speed. To facilitate communications to/from endpoint computing devices, the data networks typically include one or more network computing devices (e.g., compute servers, storage servers, etc.) to route communications (e.g., via network switches, network routers, etc.) that enter/exit a network (e.g., north-south network traffic) and between network computing devices in the network (e.g., east-west network traffic). These endpoint computing devices and network computing devices often rely on multiple communications protocols for exchanging messages.

However, packet loss can be common using certain transmission types, such as wireless-based systems (e.g., IEEE 802.11, unlicensed spectrum LTE, Small Cell, etc.) in which the wireless connectivity cannot be assured, such as during periods of device usage in remote locations with unreliable infrastructure and/or during periods of high-speed mobility, or in some cases, due to congestion or signal interference. As such, reliable transport protocols are often used to compensate for unreliable link layers and packet loss. However, doing so can add significant latency. For example, internet of things (IoT) devices may have intermittent connectivity, which can make the acknowledgements and retransmission of otherwise reliable protocols difficult if not altogether impossible. Accordingly, it can be difficult to rely on "chatty" reliability protocols, such as TCP, which require frequent two-way communication exchanges (e.g., to identify/request lost or corrupt network packets). Further, limited IoT device memory resources may limit buffering capacity, and compute/power restrictions can often limit the amount of software protocol layer packet recovery that can be accomplished.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
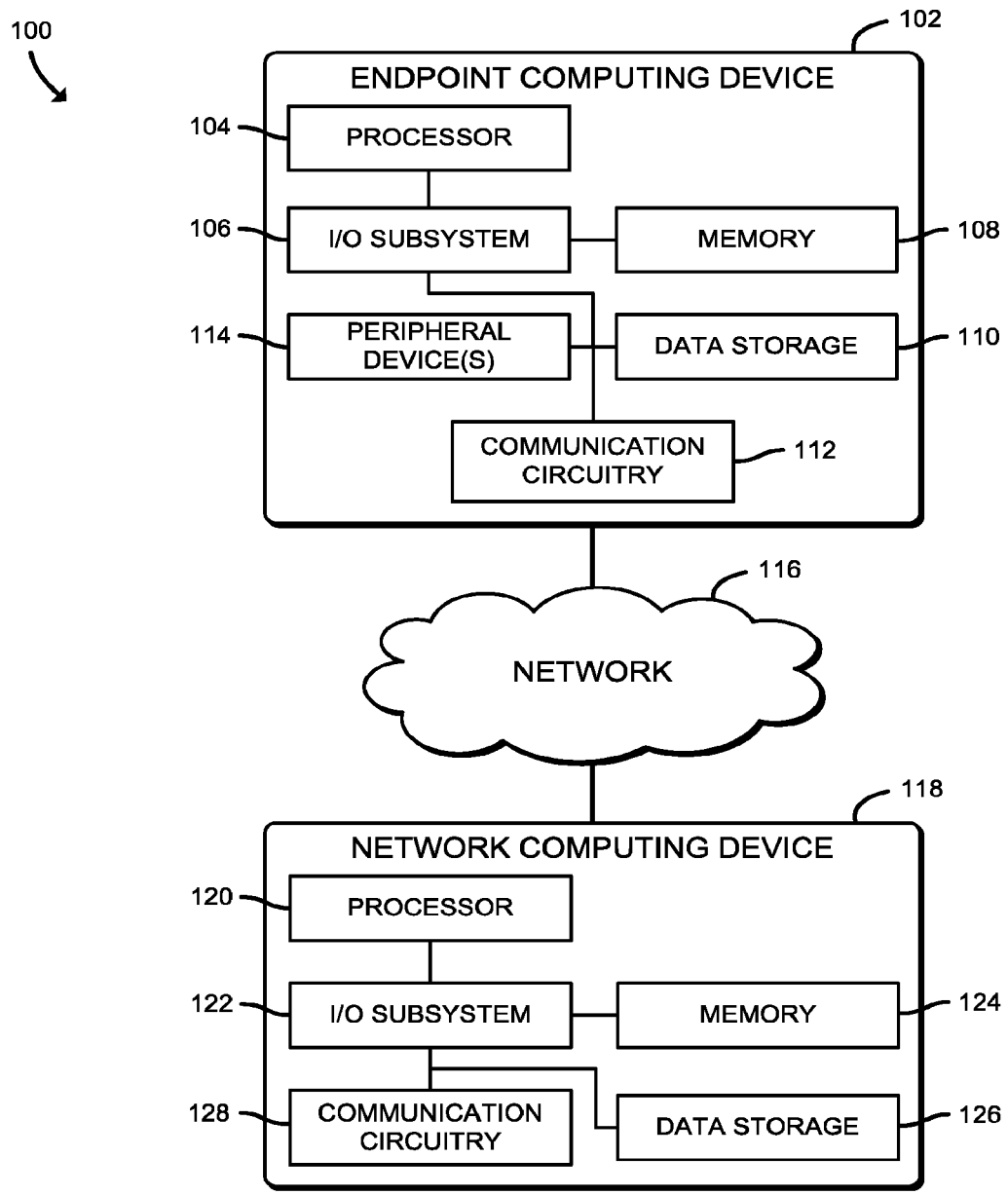
FIG. 1 is a simplified block diagram of at least one embodiment of a system for applying a redundancy encoding scheme to segmented portions of a data block that includes an endpoint device coupled to a network computing device via a network.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one of A, B, and C" can mean (A); (B); (C): (A and B); (A and C); (B and C); or (A, B, and C).

Similarly, items listed in the form of "at least one of A, B, or C" can mean (A); (B); (C): (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device). As used herein, the term computer-readable storage media is expressly defined to exclude propagating signals and to exclude transmission media.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in an illustrative embodiment, a system 100 for applying a redundancy encoding scheme to segments of a block of data (e.g., a data packet stream) includes an endpoint computing device 102 in network communication with a network computing device 118 via a network 116. In use, the endpoint computing device 102 transmits and receives information (e.g., data) via a networked client application (e.g., a web application, an internet of things (IoT) application, an enterprise application, a cloud-based application, a mobile device application, etc.). Such information is transmitted/received in the form of a series, or flow, of network packets, which may be processed by the receiving computing device (i.e., upon receipt of one or more of the network packets).

Many modern protocol stacks and network controllers support segmentation offload, a technique commonly used for increasing egress throughput of high-bandwidth network connections. To perform the segmentation offload operation, the transmitting computing device (e.g., the endpoint computing device 102) is configured to partition a block of data, commonly referred to as a "window," into segments which can be sent to the receiving computing device (e.g., the network computing device 118).

In addition to segmenting the block of data into multiple data segments, as will be discussed in further detail below, the transmitting computing device is configured to apply a redundancy encoding scheme to each data segment, such that each network packet associated with the data block includes a data segment of the data block and redundant data of at least one other data segment which can be used to reconstruct one or more other data segments associated with that block of data. The receiving computing device is configured to reconstruct lost or corrupt network packets (i.e., that included a data segment), assuming the network packets which include the applicable redundant data have been received. Accordingly, by being able to reconstruct the lost or corrupt network packets, the receiving computing device does not need to request those lost or corrupt network packets from the transmitting computing device, thereby increasing loss tolerance, data integrity, and the likelihood of data delivery in areas (e.g., remote locations with unreliable infrastructure) and/or under certain conditions (e.g., during periods of high-speed mobility) in which wireless connectivity cannot be assured.

Additionally, in some embodiments, the receiving computing device may be configured to proactively attempt to construct the content of network packets which have not yet been received by using the redundant data of those network packets which have been received. As such, the data may be passed up the stack prior to all of the network packets associated with the initial block of data being received. Accordingly, the intended payload is not subjected to the latency of redundant packets and may already be acted on by the time the final network packet(s) arrive, which can be a useful solution in deployments that are heavily affected by latency spikes (e.g., telecommunication infrastructure, cloud deployments, etc.).

The endpoint computing device 102 may be embodied as any type of computation or computer device capable of performing the functions described herein, including, without limitation, a smartphone, a mobile computing device, a tablet computer, a laptop computer, a notebook computer, a computer, a server (e.g., stand-alone, rack-mounted, blade, etc.), a network appliance (e.g., physical or virtual), a web appliance, a distributed computing system, a processor-based system, and/or a multiprocessor system. As shown in FIG. 1, the illustrative endpoint device includes a processor 104, an input/output (I/O) subsystem 106, a memory 108, a data storage device 110, communication circuitry 112, and one or more peripheral devices 114. Of course, in other embodiments, the endpoint computing device 102 may include alternative or additional components, such as those commonly found in a computing device (e.g., a graphics processing unit (GPU), a power supply, fans, etc.). Additionally, in some embodiments, one or more of the illustrative components may be incorporated in, or otherwise form a portion of, another component. For example, the memory 108, or portions thereof, may be incorporated into the processor 104, in some embodiments. Further, in some embodiments, one or more of the illustrative components may be omitted from the endpoint computing device 102.

The processor 104 may be embodied as any type of central processing unit capable of carrying out instructions to perform the functions described herein. For example, the processor 104 may be embodied as a single core processor, a multi-core processor, a digital signal processor (DSP), a field programmable gate array (FPGA), a microcontroller, or other processor or processing/controlling circuit. Irrespective of the embodiment of the processor 104, the processor 104 may be embodied as an independent logical execution unit capable of executing programmed instructions. In some embodiments, the processor 104 may include a portion of cache memory (i.e., memory that can be accessed more quickly than the memory 108) and functional units usable to independently execute programs or threads, which are not shown to preserve clarity of the description. It should be appreciated that, in some embodiments, the endpoint computing device 102 may contain more than one processor 104.

The memory 108 may be embodied as any type of volatile or non-volatile memory or data storage capable of performing the functions described herein. In operation, the memory 108 may store various data and software used during operation of the endpoint computing device 102, such as operating systems, applications, programs, libraries, and drivers. The memory 108 is communicatively coupled to the processor 104 via the I/O subsystem 106, which may be embodied as circuitry and/or components to facilitate input/output operations with the processor 104, the memory 108, and other components of the endpoint computing device 102. For example, the I/O subsystem 106 may be embodied as, or otherwise include, memory controller hubs, input/output control hubs, firmware devices, communication links (i.e., point-to-point links, bus links, wires, cables, light guides, printed circuit board traces, etc.), and/or other components and subsystems to facilitate the input/output operations. In some embodiments, the I/O subsystem 106 may form a portion of a system-on-a-chip (SoC) and be incorporated, along with the processor 104, the memory 108, and other components of the endpoint computing device 102, on a single integrated circuit chip.

The data storage device 110 may be embodied as any type of device or devices configured for short-term or long-term storage of data such as, for example, memory devices and circuits, memory cards, hard disk drives, solid-state drives, or other data storage devices. It should be appreciated that the data storage device 110 and/or the memory 108 (e.g., the computer-readable storage media) may store various data as described herein, including operating systems, applications, programs, libraries, drivers, instructions, etc., capable of being executed by a processor (e.g., the processor 104) of the endpoint computing device 102.

The communication circuitry 112 may be embodied as any communication circuit, device, or collection thereof, capable of enabling communications between the endpoint computing device 102 and other computing devices, such as the network computing device 118, as well as any network communication enabling devices, such as an access point, network switch/router, etc., to allow communication over the network 116. The communication circuitry 112 may be configured to use any one or more communication technologies (e.g., wireless or wired communication technologies) and associated protocols (e.g., Ethernet, Bluetooth®, WiFi®, WiMAX, LTE, 5G, etc.) to effect such communication.

It should be appreciated that, in some embodiments, the communication circuitry 112 may include specialized circuitry, hardware, or combination thereof to perform pipeline logic (e.g., hardware algorithms) for performing the functions described herein, including processing network packets (e.g., parse received network packets, determine destination computing devices for each received network packets, forward the network packets to a particular buffer queue of a respective host buffer of the endpoint computing device 102, etc.), perform computational functions, etc.

In some embodiments, performance of one or more of the functions of communication circuitry 112 as described herein may be performed by specialized circuitry, hardware, or combination thereof of the communication circuitry 112, which may be embodied as a system-on-a-chip (SoC) or otherwise form a portion of a SoC of the network computing device 118 (e.g., incorporated on a single integrated circuit chip along with the processor 104, the memory 108, and/or other components of the endpoint computing device 102). Alternatively, in some embodiments, the specialized circuitry, hardware, or combination thereof may be embodied as one or more discrete processing units of the endpoint computing device 102, each of which may be capable of performing one or more of the functions described herein.

The peripheral device(s) 114 may include any type of device that is usable to input information into the endpoint computing device 102 and/or receive information from the endpoint computing device 102. The peripheral devices 114 may be embodied as any auxiliary device usable to input information into the endpoint computing device 102, such as a keyboard, a mouse, a microphone, a barcode reader, an image scanner, etc. or output information from the endpoint computing device 102, such as a display, a speaker, graphics circuitry, a printer, a projector, etc. It should be appreciated that, in some embodiments, one or more of the peripheral devices 114 may function as both an input device and an output device (e.g., a touchscreen display, a digitizer on top of a display screen, etc.). It should be further appreciated that the types of peripheral devices 114 connected to the endpoint computing device 102 may depend on, for example, the type and/or intended use of the endpoint computing device 102. Additionally or alternatively, in some embodiments, the peripheral devices 114 may include one or more ports, such as a USB port, for example, for connecting external peripheral devices to the endpoint computing device 102.

The network 116 may be embodied as any type of wired or wireless communication network, including but not limited to a wireless local area network (WLAN), a wireless personal area network (WPAN), a cellular network (e.g., Global System for Mobile Communications (GSM), Long-Term Evolution (LTE), etc.), a telephony network, a digital subscriber line (DSL) network, a cable network, a local area network (LAN), a wide area network (WAN), a global network (e.g., the Internet), or any combination thereof. It should be appreciated that, in such embodiments, the network 116 may serve as a centralized network and, in some embodiments, may be communicatively coupled to another network (e.g., the Internet). Accordingly, the network 116 may include a variety of other virtual and/or physical network computing devices (e.g., routers, switches, network hubs, servers, storage devices, compute devices, etc.), as needed to facilitate communication between the endpoint computing device 102 and the network computing device 118, which are not shown to preserve clarity of the description.

The network computing device 118 may be embodied as any type of network traffic managing, processing, and/or forwarding device, such as a server (e.g., stand-alone, rack-mounted, blade, etc.), an enhanced network interface controller (NIC) (e.g., a host fabric interface (HFI)), a network appliance (e.g., physical or virtual), a virtual or physical switch (e.g., a disaggregated switch, a rack-mounted switch, a standalone switch, a fully managed switch, a partially managed switch, a full-duplex switch, and/or a half-duplex communication mode enabled switch), a router, a web appliance, a distributed computing system, a processor-based system, and/or a multiprocessor system. It should be appreciated that while the illustrative system 100 includes only includes a single network computing device 118, there may be any number of additional network computing devices, as well any number of additional endpoint devices 102, in other embodiments.

As shown in FIG. 1, similar to the previously described endpoint computing device 102, the illustrative network computing device 118 includes a processor 120, an I/O subsystem 122, a memory 124, a data storage device 126, and communication circuitry 128. As such, further descriptions of the like components are not repeated herein for clarity of the description with the understanding that the description of the corresponding components provided above in regard to the endpoint computing device 102 applies equally to the corresponding components of the network computing device 118. Of course, it should be appreciated that the network computing device 118 may include additional and/or alternative components, such as those commonly found in a server, router, switch, or other network device, depending on the embodiment. Additionally, in some embodiments, one or more of the illustrative components may be incorporated in, or otherwise form a portion of, another component.

Figure 2:
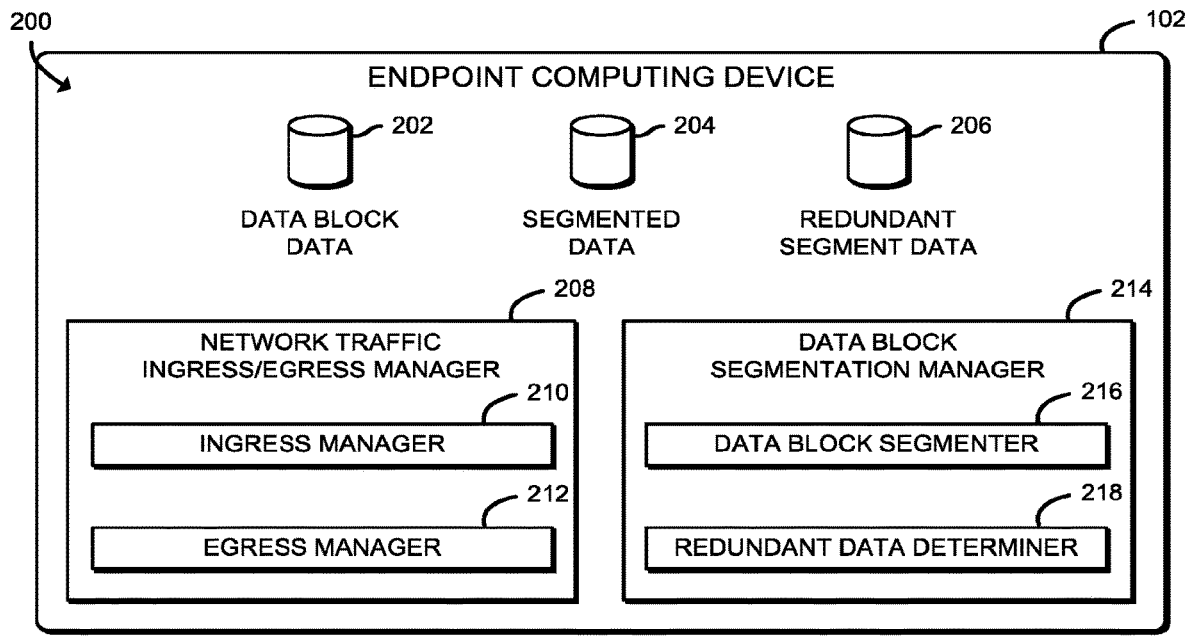
FIG. 2 is a simplified block diagram of at least one embodiment of an environment of the endpoint computing device of the system of FIG. 1.

Referring now to FIG. 2, in use, the endpoint computing device 102 establishes an environment 200 during operation. The illustrative environment 200 includes a network traffic ingress/egress manager 208 and a data block segmentation manager 214. The various components of the environment 200 may be embodied as hardware, firmware, software, or a combination thereof. As such, in some embodiments, one or more of the components of the environment 200 may be embodied as circuitry or collection of electrical devices (e.g., a network traffic ingress/egress circuit 208, a data block segmentation circuit 214, etc.).

It should be appreciated that, in such embodiments, one or more of the network traffic ingress/egress circuit 208 and the data block segmentation circuit 214 may form a portion of one or more of the processor 102, the I/O subsystem 104, the communication circuitry 112, and/or other components of the endpoint computing device 102. Additionally, in some embodiments, one or more of the illustrative components may form a portion of another component and/or one or more of the illustrative components may be independent of one another. Further, in some embodiments, one or more of the components of the environment 200 may be embodied as virtualized hardware components or emulated architecture, which may be established and maintained by the processor 102 or other components of the endpoint computing device 102. It should be appreciated that the endpoint computing device 102 may include other components, sub-components, modules, sub-modules, logic, sub-logic, and/or devices commonly found in a computing device, which are not illustrated in FIG. 2 for clarity of the description. In some embodiments, a custom network stack on either the ingress or egress side could be used (e.g., to ensure that a traditional TCP stack does not), such as in a subset of specialized deployments.

In the illustrative environment 200, the endpoint computing device 102 additionally includes data block data 202, segmented data 204, and redundant segment data 206, each of which may be accessed by the various components and/or sub-components of the endpoint computing device 102. Further, each of the data block data 202, the segmented data 204, and the redundant segment data 206 may be accessed by the various components of the endpoint computing device 102. Additionally, it should be appreciated that in some embodiments the data stored in, or otherwise represented by, each of the data block data 202, the segmented data 204, and the redundant segment data 206 may not be mutually exclusive relative to each other. For example, in some implementations, data stored in the data block data 202 may also be stored as a portion of one or more of the segmented data 204 and the redundant segment data 206, or vice versa. As such, although the various data utilized by the endpoint computing device 102 is described herein as particular discrete data, such data may be combined, aggregated, and/or otherwise form portions of a single or multiple data sets, including duplicative copies, in other embodiments.

The network traffic ingress/egress manager 208, which may be embodied as hardware, firmware, software, virtualized hardware, emulated architecture, and/or a combination thereof as discussed above, is configured to receive inbound and route/transmit outbound network traffic. To do so, the illustrative network traffic ingress/egress manager 208 includes an ingress manager 210 and an egress manager 212. The ingress manager 210 is configured to facilitate inbound network communications (e.g., network traffic, network packets, network flows, etc.) to the endpoint computing device 102. To do so, the ingress manager 210 is configured to manage (e.g., create, modify, delete, etc.) connections to physical and virtual network ports (i.e., virtual network interfaces) of the endpoint computing device 102 (e.g., via the communication circuitry 112), as well as the ingress buffers/queues associated therewith.

The egress manager 212 is configured to facilitate outbound network communications (e.g., network traffic, network packet streams, network flows, etc.) from the endpoint computing device 102. To do so, the egress manager 212 is configured to manage (e.g., create, modify, delete, etc.) connections to physical and virtual network ports/interfaces of the endpoint computing device 102 (e.g., via the communication circuitry 112), as well as the egress buffers/queues associated therewith. Additionally, the egress manager 212 is configured to construct/add the appropriate headers at the applicable layers to the network packet and add the payload (i.e., the data segment) and redundant data, as well as any footers, such as may be used to store error-detecting code (e.g., cyclic redundancy check (CRC) data verification information). Such inbound/outbound network communications may be stored in the data block data 202, in some embodiments.

It should be appreciated that each of the ingress manager 210 and the egress manager 212 of the illustrative network traffic ingress/egress manager 208 may be separately embodied as hardware, firmware, software, virtualized hardware, emulated architecture, and/or a combination thereof. For example, the ingress manager 210 may be embodied as a hardware component, while the egress manager 212 may be embodied as a virtualized hardware component or as some other combination of hardware, firmware, software, virtualized hardware, emulated architecture, and/or a combination thereof.

The data block segmentation manager 214, which may be embodied as hardware, firmware, software, virtualized hardware, emulated architecture, and/or a combination thereof as discussed above, is configured to divide a data block into smaller units for transmission (e.g., to the network computing device 118 of FIG. 1) over a network (e.g., the network 116 of FIG. 1) in a data packet stream. To do so, the illustrative data block segmentation manager 214 includes a data block segmenter 216 and a redundant data determiner 218. The data block segmenter 216 is configured to perform a segmentation offload operation on blocks of data. In some embodiments, the segmented packets may be stored in the segmented data 204.

Typically, data block segmentation is performed such that each segmented data block does not exceed a maximum transmission unit (MTU), which may be indicated by the network computing device 118 or automatically detected by the endpoint computing device 102. It should be appreciated that additional conditions, such as network reliability, for example, may affect the maximum network packet segment size. However, as described herein, the network packet segment size, and thereby the number of network packets each data block will be divided into, is further predicated upon the type of redundancy encoding scheme being employed.

Accordingly, the data block segmenter 216 is additionally configured to perform the segmentation offload operation as a function of the type of redundancy encoding scheme being employed and append the applicable redundant data to the segmented data of each network packet. The redundancy encoding scheme may be any type of encoding scheme in which each network packet associated with of a data block includes redundant data which can be used to reconstruct one or more other data block segments of that data block, such as an erasure coding scheme, a hash-based redundancy scheme, etc. In one such embodiment, the redundancy encoding scheme may be a packet level erasure code protocol represented in the form: EC (k/n), which uses the following equation: n=k+m, wherein the k-value is the original amount of data or symbols, the m-value is the redundant symbols that are added to provide redundancy, and the n-value is the total number of symbols created after the erasure code process. Using the packet level erasure code protocol, the data block segmenter 216 is configured to determine the encoding configuration, the size of the window (i.e., block of data) to be transmitted, and segment the data block for transmission to the destination computing device (e.g., the network computing device 118 of FIG. 1) in a data packet stream.

In an illustrative example in which the data block segmenter 216 is configured to use an encoding scheme having an EC (10/16) configuration (i.e., six extra symbols (m) are added to the ten initial symbols (k)) and a 14K (i.e., 14,336 bytes) window of data to be transmitted, the data block segmenter 216 would segment the transmit window into 16 network packets. Accordingly, unlike traditional techniques in which the transmit window would be segmented into ten network packets (e.g., based on a maximum transmission unit of 1500 bytes), sixteen network packets allows space for the redundant data. As such, in the present illustrative example, as long as any ten of the sixteen network packets have been received, the entirety of the initial block of data can be reconstructed. In turn, retransmission requests for lost/corrupt network packets, which are common in noisy/lossy network environments, can be reduced, as the transmissions can be received more reliably due to the redundant data contained within each network packet.

It should be appreciated that such an approach changes the layer 2 encoding, as the segment size is adjusted to allow for the redundant data. However, reliable transport protocols, such as transmission control protocol (TCP), could still be used on top of this connection layer encoding, which could allow for reliability above and beyond the layer 2 solution. It should be further appreciated that segmenting the data in accordance with the redundancy encoding scheme and appending the redundant data to each network packet should be compatible with transport and internet protocol (IP) layer protection protocols, such as IPsec, Transport Layer Security (TLS)/Secure Sockets Layer (SSL), Datagram Transport Layer Security (DTLS), and/or the like. Additionally, such an implementation should also work for Wi-Fi® (IEEE 802.11 WPA/WPA2) security protocols, as the WiFi® link encryption may be performed "on top" of the proposed redundancy encoding scheme, as well as opportunistic encryption techniques as the TCP layer, using the same rationale.

The redundant data determiner 218, which may be embodied as hardware, firmware, software, virtualized hardware, emulated architecture, and/or a combination thereof as discussed above, is configured to generate the redundant data for each data segment based on the redundancy encoding scheme being employed. In some embodiments, the generated redundant data may be stored in the redundant segment data 206. As noted previously, the redundancy encoding scheme may be any type of encoding scheme in which each data segment of a data block includes redundant data which can be used to reconstruct one or more other data segments of that data block. Accordingly, depending on the type of redundancy encoding scheme being employed, the redundant data determiner 218 is configured to include into each network packet the redundant data necessary to reconstruct one or more other data segments. It should be appreciated that, in some embodiments, depending on the type of redundancy encoding scheme employed, more than one network packet, or more particularly the redundant data included therein, may be required to reconstruct another data segment.

It should be appreciated that each of the segmentation determiner 214 and the data block segmenter 216 of the illustrative data block segmentation manager 214 may be separately embodied as hardware, firmware, software, virtualized hardware, emulated architecture, and/or a combination thereof. For example, the segmentation determiner 214 may be embodied as a hardware component, while the data block segmenter 216 may be embodied as a virtualized hardware component or as some other combination of hardware, firmware, software, virtualized hardware, emulated architecture, and/or a combination thereof.

Figure 3:
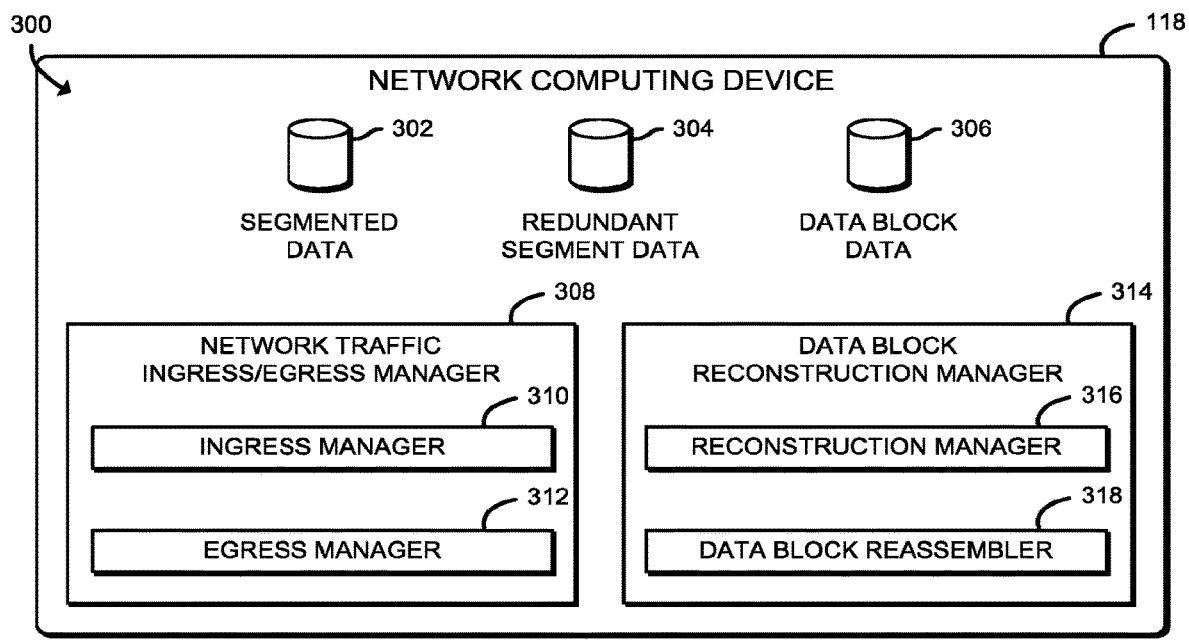
FIG. 3 is a simplified block diagram of at least one embodiment of an environment of the network computing device of the system of FIG. 1.

Referring now to FIG. 3, in use, the network computing device 118 establishes an environment 300 during operation. The illustrative environment 300 includes a network traffic ingress/egress manager 308 and a data block reconstruction manager 314. The various components of the environment 300 may be embodied as hardware, firmware, software, or a combination thereof. As such, in some embodiments, one or more of the components of the environment 300 may be embodied as circuitry or collection of electrical devices (e.g., a network traffic ingress/egress circuit 308, a data block reconstruction circuit 314, etc.). It should be appreciated that, in such embodiments, one or more of the network traffic ingress/egress circuit 308 and the data block reconstruction circuit 314 may form a portion of one or more of the processor 120, the I/O subsystem 122, the communication circuitry 128, and/or other components of the network computing device 118.

Additionally, in some embodiments, one or more of the illustrative components may form a portion of another component and/or one or more of the illustrative components may be independent of one another. Further, in some embodiments, one or more of the components of the environment 300 may be embodied as virtualized hardware components or emulated architecture, which may be established and maintained by the processor 120 or other components of the network computing device 118. It should be appreciated that the network computing device 118 may include other components, sub-components, modules, sub-modules, logic, sub-logic, and/or devices commonly found in a computing device, which are not illustrated in FIG. 3 for clarity of the description.

In the illustrative environment 300, the network computing device 118 additionally includes segmented data 302, redundant segment data 304, and data block data 306 each of which may be accessed by the various components and/or sub-components of the network computing device 118. Further, each of the segmented data 302, the redundant segment data 304, and the data block data 306 may be accessed by the various components of the network computing device 118. Additionally, it should be appreciated that in some embodiments the data stored in, or otherwise represented by, each of the segmented data 302, the redundant segment data 304, and the data block data 306 may not be mutually exclusive relative to each other. For example, in some implementations, data stored in the segmented data 302 may also be stored as a portion of one or more of the redundant segment data 304 and the data block data 306, or vice versa. As such, although the various data utilized by the network computing device 118 is described herein as particular discrete data, such data may be combined, aggregated, and/or otherwise form portions of a single or multiple data sets, including duplicative copies, in other embodiments.

The network traffic ingress/egress manager 308, which may be embodied as hardware, firmware, software, virtualized hardware, emulated architecture, and/or a combination thereof as discussed above, is configured to receive inbound and route/transmit outbound network traffic. To do so, similar to the illustrative network traffic ingress/egress manager 208 of the endpoint computing device 102 of FIG. 2, the illustrative network traffic ingress/egress manager 308 includes an ingress manager 310 and an egress manager 312. The ingress manager 310 is configured to facilitate inbound network communications (e.g., network traffic, network packets, network flows, etc.) to the network computing device 118. To do so, the ingress manager 310 is configured to manage (e.g., create, modify, delete, etc.) connections to physical and virtual network ports (i.e., virtual network interfaces) of the network computing device 118 (e.g., via the communication circuitry 128), as well as the ingress buffers/queues associated therewith. Additionally, the ingress manager 310 is configured to parse received network packets to extract data therefrom, such as headers, payload, redundant data, footers, etc. (see, e.g., the illustrative network packet 600 of FIG. 6). Such extracted payload data may be stored in the segmented data 302 and/or the redundant data may be stored in the redundant segment data 304, in some embodiments.

Figure 6:
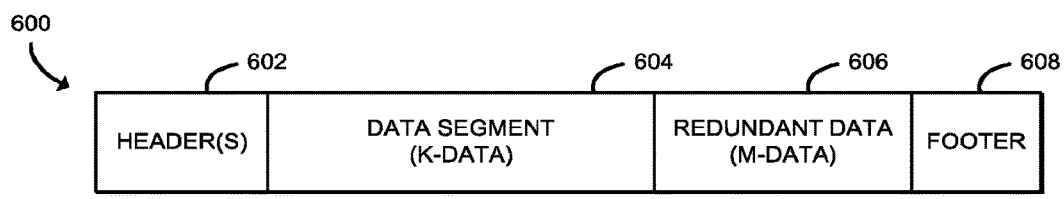
FIG. 6 is a simplified block diagram of a network packet that includes a segment of a block of data and redundant data of at least one other segment of the block of data.

The egress manager 312 is configured to facilitate outbound network communications (e.g., network traffic, network packet streams, network flows, etc.) from the network computing device 118. To do so, the egress manager 312 is configured to manage (e.g., create, modify, delete, etc.) connections to physical and virtual network ports/interfaces of the network computing device 118 (e.g., via the communication circuitry 128), as well as the egress buffers/queues associated therewith. Additionally, the egress manager 312 is configured to construct/add the appropriate headers at the applicable layers to the network packet and add the payload and redundant data, as well as any footers, such as may be used to store error-detecting code (e.g., cyclic redundancy check (CRC) data verification information). Such inbound/outbound network communications may be stored in the data block data 306, in some embodiments. Referring now to FIG. 6, an illustrative formatted network packet 600 is shown which includes one or more headers 602, data segment 604, redundant data 606, and a footer 608.

It should be appreciated that each of the ingress manager 310 and the egress manager 312 of the illustrative network traffic ingress/egress manager 308 may be separately embodied as hardware, firmware, software, virtualized hardware, emulated architecture, and/or a combination thereof. For example, the ingress manager 310 may be embodied as a hardware component, while the egress manager 312 may be embodied as a virtualized hardware component or as some other combination of hardware, firmware, software, virtualized hardware, emulated architecture, and/or a combination thereof.

The data block reconstruction manager 314, which may be embodied as hardware, firmware, software, virtualized hardware, emulated architecture, and/or a combination thereof as discussed above, is configured to reconstruct a block of data from the smaller units received via transmission (e.g., from the endpoint computing device 102 of FIG. 1) over a network (e.g., the network 116 of FIG. 1). To do so, the illustrative data block reconstruction manager 314 includes a reconstruction manager 316 and a data block reassembler 318. The reconstruction manager 316 is configured to determine when and how to reconstruct received network packets, based on the redundancy encoding scheme used by the transmitting endpoint computing device (e.g., the endpoint computing device 102 of FIG. 1).

To do so, the reconstruction manager 316 is configured to determine whether to reconstruct a network packet, or more particularly the data segment thereof, such as may be based on a particular policy or rule. In some embodiments, the reconstruction manager 316 may be configured to reconstruct the data segment upon having determined that a network packet has been lost or corrupted. Additionally or alternatively, in some embodiments, the reconstruction manager 316 may be configured to reconstruct a data segment upon having determined that a sufficient number of network packets have been received to reconstruct a missing or otherwise not yet received network packet therefrom. For example, in an embodiment in which the reconstruction manager 316 has determined the redundancy encoding scheme used was an EC (10/16) configuration (i.e., six extra symbols have been added to the ten initial symbols), upon having received ten of the sixteen network packets associated with a particular window, the reconstruction manager 316 may be configured to proactively reconstruct any of the remaining six network packets (i.e., the segmented data associated therewith). In some embodiments, the reconstructed segmented data may be stored in the segmented data 302.

The data block reassembler 318 is configured to construct the block of data from the segmented packets associated with the original data block (i.e., window of data) which was segmented (e.g., by the data block segmentation manager 214 of the endpoint computing device 102 of FIG. 2) prior to transmission to the network computing device 118. To do so, the data block reassembler 318 is configured to identify segmented data, either received or reconstructed, which are associated with the same original window of data and reassemble the data.

Figure 4:
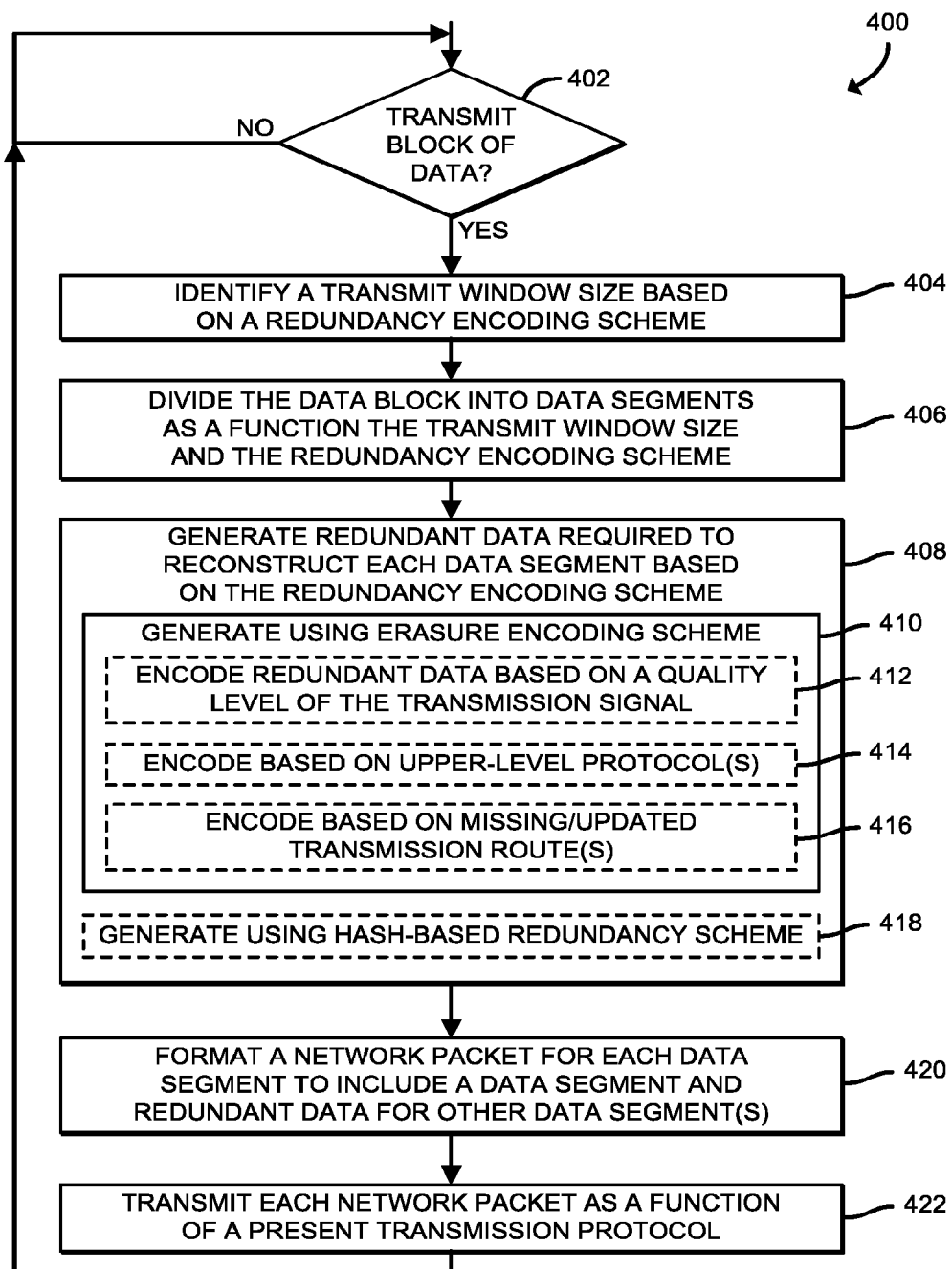
FIG. 4 is a simplified flow diagram of at least one embodiment of a method for applying a redundancy encoding scheme to segmented portions of a data block that may be executed by the endpoint computing device of FIGS. 1 and 2.

Referring now to FIG. 4, a method 400 for applying a redundancy encoding scheme to segmented portions of a data block is shown which may be executed by an endpoint computing device (e.g., the endpoint computing device 102 of FIG. 1). The method 400 begins with block 402, in which the endpoint computing device 102 determines whether to transmit a block of data (e.g., from an egress buffer queue of the endpoint computing device 102) to a destination computing device (e.g., the network computing device 118 of FIG. 1). If the endpoint computing device 102 determines that a data block is to be transmitted, the method 400 advances to block 404. In block 404, the endpoint computing device 102 identifies a transmit window size based, at least in part, on a redundancy encoding scheme to be applied to segments of the block of data to be transmitted.

As described previously, the redundancy encoding scheme may be any type of encoding scheme in which each network packet associated with a block, or window, of data includes redundant data which can be used to reconstruct one or more other data segments of that data block. As also described previously, the transmit window size is typically dependent on an MTU, which may be indicated by the destination computing device (e.g., the network computing device 118) or automatically determined by the endpoint computing device 102 (e.g., by the operating system). It should be appreciated that additional conditions, such as network reliability, may influence the transmit window size in some embodiments. In block 406, the endpoint computing device 102 divides the data block into data segments as a function of the transmit window size and the redundancy encoding scheme.

In block 408, the endpoint computing device 102 generates redundant data required to reconstruct each data segment based on the redundancy encoding scheme. To do so, in block 410, the endpoint computing device 102 may generate the redundant data using a packet level erasure code protocol represented in the form: EC (k/n), for which the k-value is the original amount of data or symbols, the m-value is the redundant symbols that are added to provide redundancy, and the n-value is the total number of symbols created after the erasure code process. In some embodiments, the endpoint computing device 102 may encode the m-value dynamically.

For example, in block 412, the endpoint computing device 102 may encode the m-value (i.e., the redundant data) dynamically based on a quality level of the transmission signal, which could be determined when a link is established between the endpoint computing device 102 and the destination computing device and/or during link training. It should be appreciated that such dynamic encoding of the redundant data could limit the frequency of m-value increases that could decrease the segment size. However, it should be further appreciated that changes the encoding of the redundant data that does not change the segment size could be used to increase the bandwidth of the link. Alternatively, in another example, in block 414, the endpoint computing device 102 may base the encoding on one or more upper-level protocols, such as TCP transmission and Wi-Fi® retransmit timers. In still another example, in block 416, signaling of existing IP routing protocols may be used to determine packet drops/retransmissions, based on route updates and missing routes.

In alternative embodiments, in block 418, the endpoint computing device 102 may generate the redundant data using a hash-based redundancy scheme, such as a RAID-like hashing function in which a logical operation (e.g., XOR) is used to generate parity data, which can then be used to reconstruct the data segment of the missing/corrupt network packet using the redundant data of one or more other network packets. It should be appreciated that the level of parity may be modulated based on one or more factors, such as available bandwidth, data link reliability, available compute power of the endpoint computing device 102 (e.g., associated with the processing capability of the processor 104 and/or the processing capability of the communication circuitry 112), available memory of the endpoint computing device 102 (e.g., of the memory 108 and/or the data storage device 110), etc. In block 420, the endpoint computing device 102 formats a network packet for each data segment to include a data segment and redundant data for one or more other data segments. In block 422, the endpoint computing device 102 transmits each formatted network packet as a function of a present transmission protocol.

It should be appreciated that, in some embodiments, the method 400 may be embodied as various instructions stored on a computer-readable media, which may be executed by a processor (e.g., the processor 104), the communication circuitry 112, and/or other components of the endpoint computing device 102 to cause the endpoint computing device 102 to perform at least a portion of the method 400. The computer-readable media may be embodied as any type of media capable of being read by the endpoint computing device 102 including, but not limited to, the memory 108, the data storage device 110, other memory or data storage devices of the endpoint computing device 102, portable media readable by a peripheral device of the endpoint computing device 102, and/or other media.

While the functionality of the endpoint computing device 102 has been described herein as being performed by the endpoint computing device 102 as the source computing device, it should be appreciated that such operations may be performed at any level in the network architecture in other embodiments. For example, the endpoint computing device 102 may be an intermediate network computing device at which point network communications transmitted therefrom are not as reliable relative to the network communications prior to reaching that endpoint computing device 102 or it has been established that redundancy is required thereafter. Accordingly, at least a portion of the functions described in the method 400 may be performed by intermediate infrastructure (e.g., at the edge of a network, at a cloudlet, etc.) and the network packets including the redundancy encoded data segment(s) may be transmitted by the endpoint computing device 102 to the network computing device 118.

Figure 5:
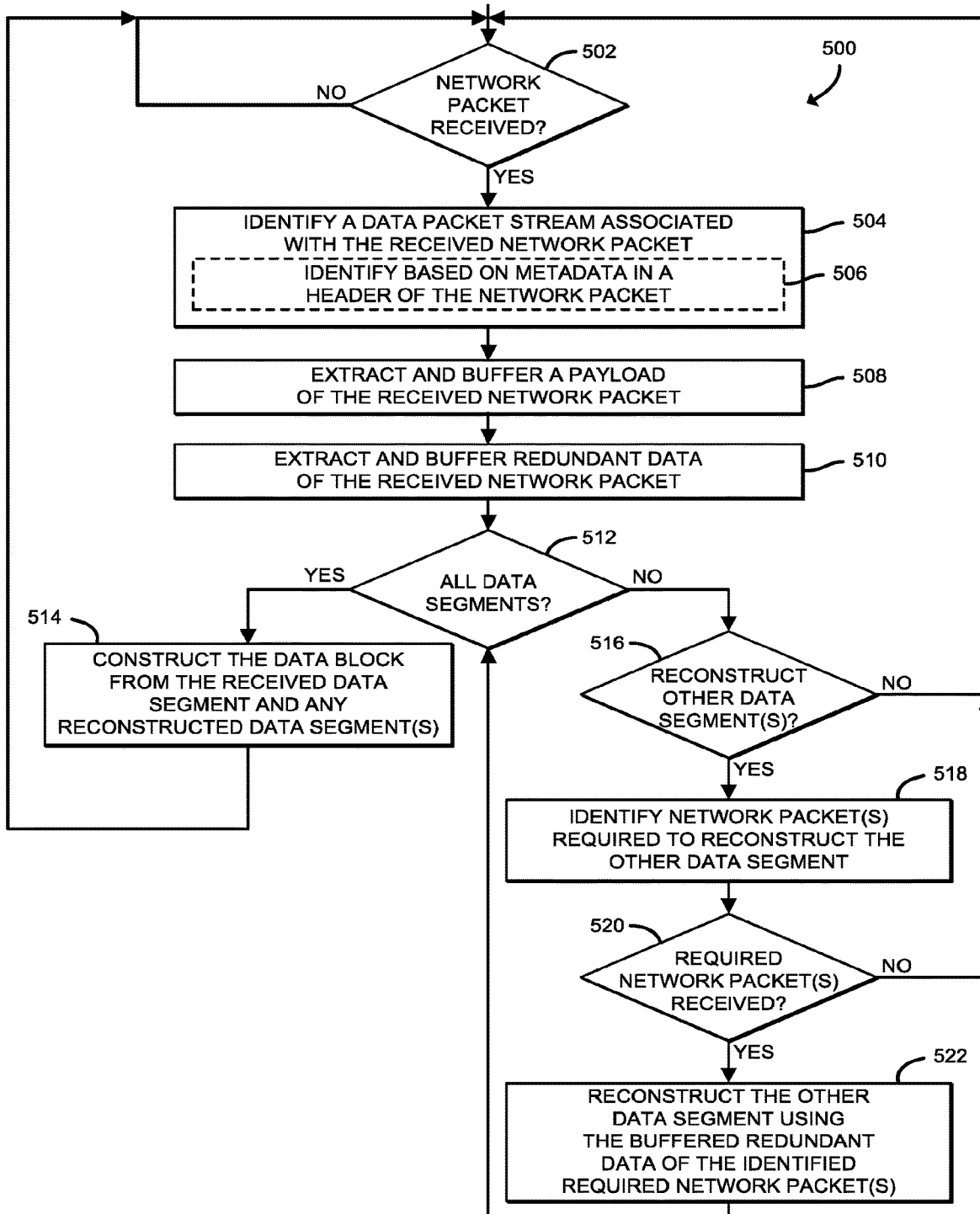
FIG. 5 is a simplified flow diagram of at least one embodiment of a method for reconstructing segmented portions of a data block based on a redundancy encoding scheme that may be executed by the network computing device of FIGS. 1 and 3.

Referring now to FIG. 5, a method 500 for reconstructing segmented portions of a data block based on a redundancy encoding scheme is shown which may be executed by a network computing device (e.g., the network computing device 118 of FIG. 1). The method 500 begins with block 502, in which the network computing device 118 determines whether a network packet has been received. If so, the method 500 advances to block 504, in which the network computing device 118 identifies a data packet stream associated with the received network packet. To do so, in block 506, the network computing device 118 may parse information from a header of the network packet that is usable to classify or otherwise identify the network packet as belonging to a particular stream, or flow, of data. In some embodiments, the network computing device 118 may additionally or alternatively perform an analysis on at least a portion of a payload of the network packet (e.g., a payload timestamp).

In block 508, the network computing device 118 extracts and buffers a payload of the received network packet which includes the data segment associated with that network packet. Similarly, in block 510, the network computing device 118 extracts and buffers the redundant data of the received network packet which includes data usable to reconstruct one or more other data segments. In block 512, the network computing device 118 determines whether all of the data segments associated with the data block corresponding to a window of data that was initially segmented by the source computing device (e.g., the endpoint computing device 102 of FIG. 1) are present.

As described previously, a block of data is segmented by the source computing device, based at least in part on the redundancy encoding scheme, into more than one data segment which is then encapsulated into a respective network packet of a series of network packets associated with that data block. In an illustrative example, a formatted network packet 600 is shown in FIG. 6 which includes one or more headers 602, data segment 604 (i.e., the data segment for that respective network packet), redundant data 606 (i.e., the redundant data for one or more other data segments), and a footer 608 (e.g., CRC data verification information). It should be appreciated that each network packet in a series of network packets associated with a particular data block may have a similar makeup (i.e., one or more headers 602, data segment 604, redundant data 606, and a footer 608) and include information (e.g., in the one or more headers 602) which is usable to identify the data block to which the data segment of the network packet corresponds, the order in which the data segments are to be reconstructed, etc.

Figure 7:
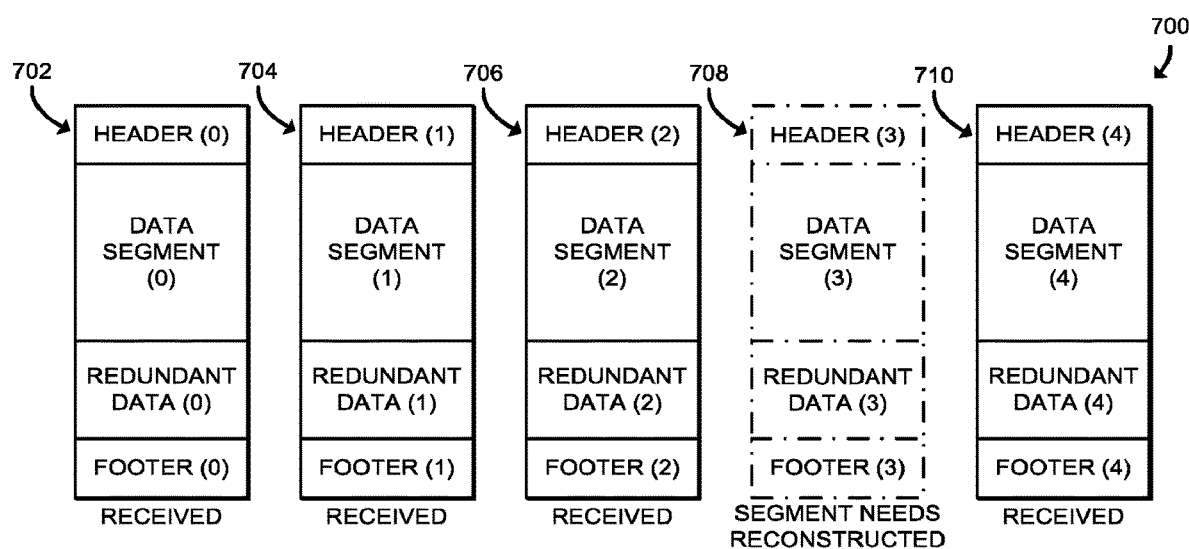
FIG. 7 is a simplified block diagram of the segments of a block of data in which each of the segments includes redundant data of at least one other segment of the block of data which is usable to reconstruct a missing/corrupt segment

For example, referring now to FIG. 7, a series of network packets 700 may include a first network packet 702, a second network packet 704, a third network packet 706, a fourth network packet 708, and a fifth network packet 710. For the purposes of this description, each of the network packets 700 includes a data segment associated with a block of data which was segmented by the source computing device and transmitted as a payload to the network computing device 118. Additionally, as noted previously, each of the network packets 700 includes the redundant data of one or more other data segments, depending on the redundancy encoding scheme used by the source computing device.

Accordingly, as illustratively shown, and described above with reference to the illustrative network packet 600 of FIG. 6, each of the network packets 700 of FIG. 7 (i.e., network packet 702, 704, 706, 708, and 710) includes one or more headers, payload (i.e., data segment), redundant data, and footers, each of which are shown as being named in accordance with their respective zero-based index reference number, which is used herein to indicate the sequence of network packets and the data segments thereof. For example, the network packet 702 is shown having an index of zero and includes one or more headers (i.e., header (0)), payload (i.e., data segment (0)), redundant data (i.e., redundant data (0)), and a footer (i.e., footer (0)), each of which are not individually referenced by a numerical identifier or described individually so as to preserve clarity of the figure and associated description.

Referring back to FIG. 5, if the network computing device 118 determines in block 512 that all of the data segments for a particular data block are present, the method 500 branches to block 514 in which the network computing device 118 constructs the data block from the received data segments and any one or more reconstructed data segments; otherwise, the method 500 branches to block 516. In block 516, the network computing device 118 determines whether to reconstruct any other data segments from the applicable redundant data previously received in other network packets of the identified data stream. For example, in some embodiments, as described previously, the network computing device 118 may be configured to reconstruct other data segments that have been determined to be lost or corrupted. Additionally, in some embodiments, the network computing device 118 may be configured to reconstruct other data segments proactively, such as when the redundant data for a particular data segment has been received, but the network packet which includes that particular data segment has not yet been received.

If the network computing device 118 determines not to reconstruct any other data segments, the method 500 returns to block 502 to determine whether another network packet has been received. Otherwise, the method 500 advances to block 518, in which the network computing device 118 identifies the one or more network packets which include the redundant data required to reconstruct the other data segment which is to be reconstructed. In block 520, the network computing device 118 determines whether the required redundant data has been received. If not, the method 500 returns to block 502 to determine whether another network packet has been received; otherwise, the method 500 advances to block 522. In block 522, the network computing device 118 reconstructs the other data segment using the buffered redundant data of the identified required network packets before the method 500 returns to block 512 to again determine whether all of the data segments for a particular data block are present.

It should be appreciated that, in some embodiments, the method 500 may be embodied as various instructions stored on a computer-readable media, which may be executed by a processor (e.g., the processor 120), the communication circuitry 128, and/or other components of the network computing device 118 to cause the network computing device 118 to perform at least a portion of the method 500. The computer-readable media may be embodied as any type of media capable of being read by the network computing device 118 including, but not limited to, the memory 124, the data storage device 126, other memory or data storage devices of the network computing device 118, portable media readable by a peripheral device of the network computing device 118, and/or other media.

It should be further appreciated that the network computing device 118 is configured to utilize the same redundancy encoding scheme to reconstruct the other data segment. Accordingly, in some embodiments, network computing device 118 may be configured to recover, or otherwise reconstruct, a data segment using redundancy symbols encapsulated in the redundant data portion of a number of received network packets, the number of which being based on the type of erasure encoding scheme used by the transmitting computing device. Alternatively, in other embodiments, a hash function may be applied to the redundant data of one or more received network packets to recover the data segment from the redundant data.

In an illustrative example, referring again to FIG. 7, the fourth network packet (i.e., network packet 708 having a zero-based sequential index of three) is illustratively shown with a line-dot line styled outline so as to indicate that that network packet 708 of the network packets 700 is corrupt, lost, has not yet been received, or needs reconstructed for another reason. Under such conditions, the network computing device 118 would identify which of the other network packets 700 include the redundant data to reconstruct the data segment that was originally transmitted from the source computing device in that fourth network packet 708.

In an illustrative example, the network computing device 118 may identify the second network packet 704, which was previously received and the redundant data extracted therefrom, as including the redundant data necessary to reconstruct the data segment of the further network packet 708. In other words, the redundant data (i.e., the redundant data (1)) of the second network packet 704 may be used to reconstruct the data segment (i.e., the data segment (3)) of the fourth network packet 708, which may have not yet been received, been determined missing, or found to have been corrupted during transmission. Under such conditions, the network computing device 118 could choose to reconstruct the fourth network packet 708 using the redundant data received with the second network packet 704.

It should be appreciated that while only a single packet was illustratively described herein as including the redundant data to recreate the data segment associated with missing/corrupt network packet, the redundant data may be stored in more than one network packet, such as when using a hash-based redundancy encoding scheme. Under such a redundancy encoding scheme, the redundant data contained in each of the other network packets 700 (i.e., network packet 702, 704, 706, and 710) may be used to reconstruct the data segment of network packet 708.

It should be further appreciated that, in some embodiments, various other encoding distances are possible. In particular, over long timespans, applications can transmit bursts of data. In such embodiments, the redundant data for a previous and future burst may be included in the intermediate burst such that entire packet bursts could go missing yet later be reconstructed. As such, instance data samples from low-bandwidth source computing devices, such as remote sensors, for example, could be reconstructed with higher probability.

While the functionality of the network computing device 118 has been described herein as being performed by the network computing device 118 as the destination computing device, it should be appreciated that such operations may be performed at any level in the network architecture in other embodiments. For example, the reconstruction of data segments of lost/corrupt network packets as described herein (i.e., using redundancy encoding schemes) may be performed by intermediate infrastructure (e.g., at the edge of a network, at a cloudlet, etc.) and the network packets including the reconstructed data segment(s) transmitted therefrom to the network computing device 118.

Figure 8:
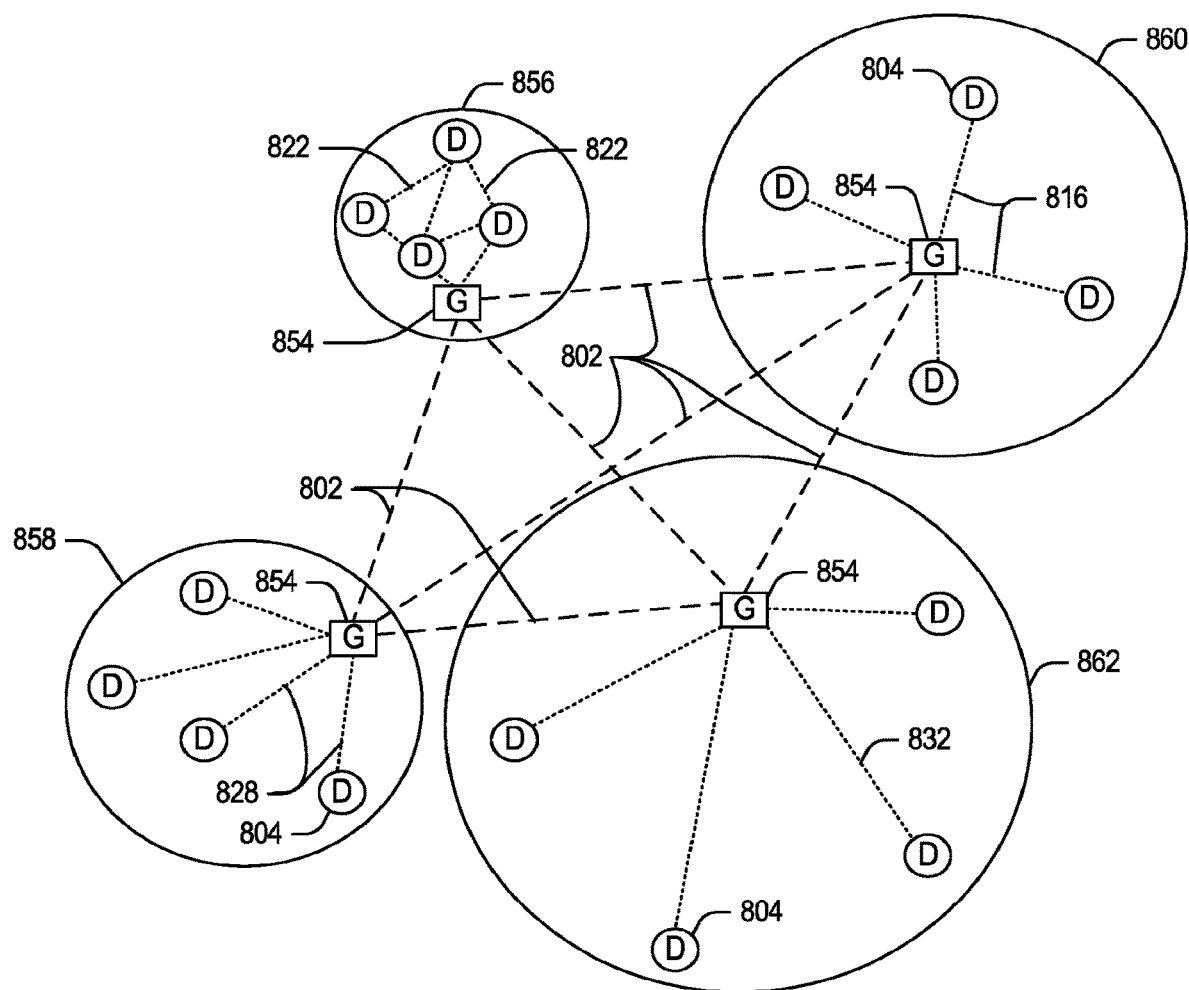
FIG. 8 illustrates an domain topology for respective internet-of-things (IoT) networks coupled through links to respective gateways, according to an example.

Referring now to FIGS. 8-11, in some embodiments, some or all of the technology described above may be embodied as or interact with one or more internet-of-things devices. FIG. 8 illustrates an example domain topology for respective internet-of-things (IoT) networks coupled through links to respective gateways. The internet of things (IoT) is a concept in which a large number of computing devices are interconnected to each other and to the Internet to provide functionality and data acquisition at very low levels. Thus, as used herein, an IoT device may include a semiautonomous device performing a function, such as sensing or control, among others, in communication with other IoT devices and a wider network, such as the Internet.

Often, IoT devices are limited in memory, size, or functionality, allowing larger numbers to be deployed for a similar cost to smaller numbers of larger devices. However, an IoT device may be a smart phone, laptop, tablet, or PC, or other larger device. Further, an IoT device may be a virtual device, such as an application on a smart phone or other computing device. IoT devices may include IoT gateways, used to couple IoT devices to other IoT devices and to cloud applications, for data storage, process control, and the like.

Networks of IoT devices may include commercial and home automation devices, such as water distribution systems, electric power distribution systems, pipeline control systems, plant control systems, light switches, thermostats, locks, cameras, alarms, motion sensors, and the like. The IoT devices may be accessible through remote computers, servers, and other systems, for example, to control systems or access data.

Figure 9:
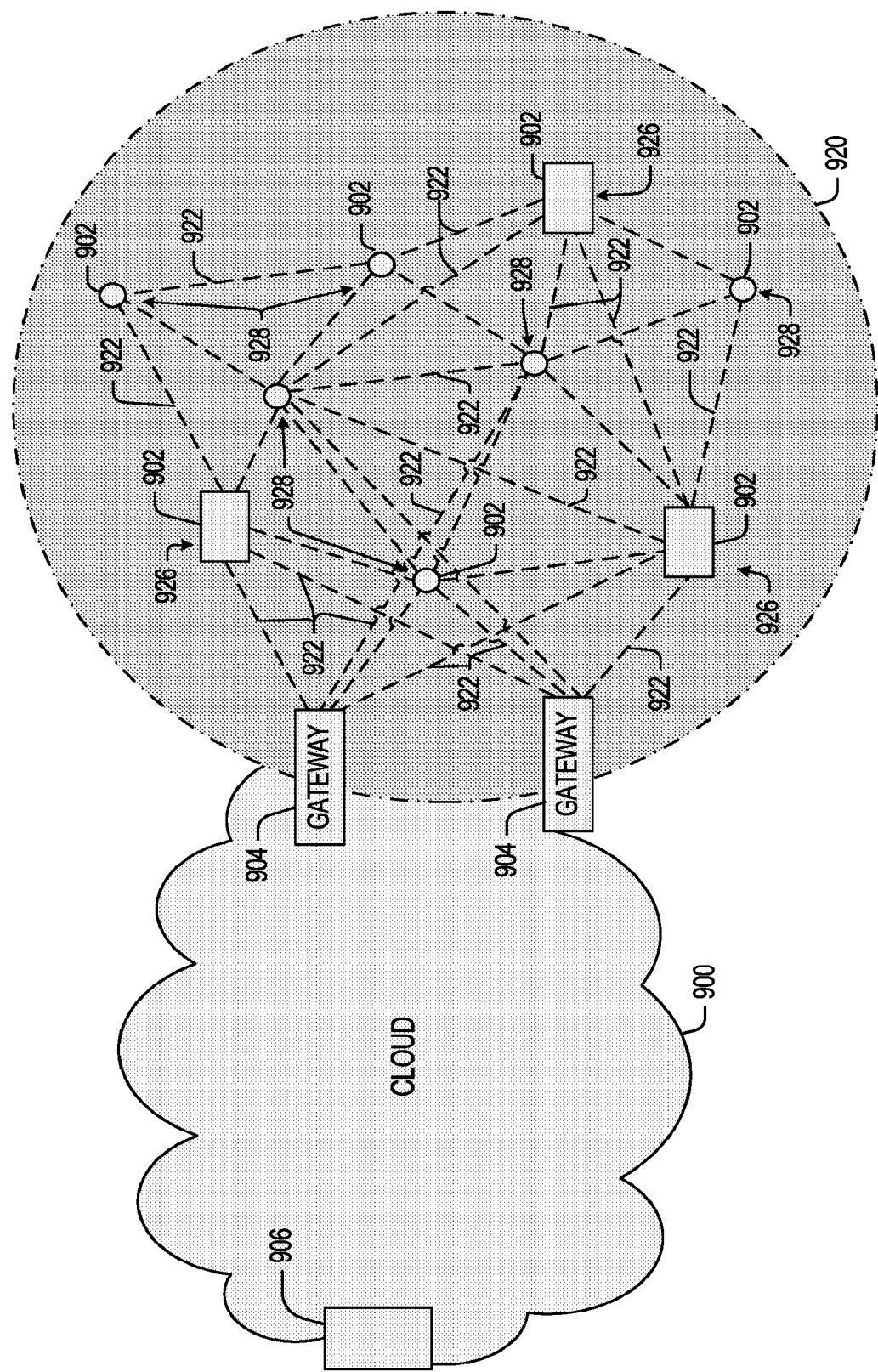
FIG. 9 illustrates a cloud computing network in communication with a mesh network of IoT devices operating as a fog device at the edge of the cloud computing network, according to an example.

The future growth of the Internet and like networks may involve very large numbers of IoT devices. Accordingly, in the context of the techniques discussed herein, a number of innovations for such future networking will address the need for all these layers to grow unhindered, to discover and make accessible connected resources, and to support the ability to hide and compartmentalize connected resources. Any number of network protocols and communications standards may be used, wherein each protocol and standard is designed to address specific objectives. Further, the protocols are part of the fabric supporting human accessible services that operate regardless of location, time or space. The innovations include service delivery and associated infrastructure, such as hardware and software; security enhancements; and the provision of services based on Quality of Service (QoS) terms specified in service level and service delivery agreements. As will be understood, the use of IoT devices and networks, such as those introduced in FIGS. 8 and 9, present a number of new challenges in a heterogeneous network of connectivity comprising a combination of wired and wireless technologies.

FIG. 8 specifically provides a simplified drawing of a domain topology that may be used for a number of internet-of-things (IoT) networks comprising IoT devices 804, with the IoT networks 856, 858, 860, 862, coupled through backbone links 802 to respective gateways 854. For example, a number of IoT devices 804 may communicate with a gateway 854, and with each other through the gateway 854. To simplify the drawing, not every IoT device 804, or communications link (e.g., link 816, 822, 828, or 832) is labeled. The backbone links 802 may include any number of wired or wireless technologies, including optical networks, and may be part of a local area network (LAN), a wide area network (WAN), or the Internet. Additionally, such communication links facilitate optical signal paths among both IoT devices 804 and gateways 854, including the use of MUXing/deMUXing components that facilitate interconnection of the various devices.

The network topology may include any number of types of IoT networks, such as a mesh network provided with the network 856 using Bluetooth low energy (BLE) links 822. Other types of IoT networks that may be present include a wireless local area network (WLAN) network 858 used to communicate with IoT devices 804 through IEEE 802.11 (Wi-Fi®) links 828, a cellular network 860 used to communicate with IoT devices 804 through an LTE/LTE-A (4G) or 5G cellular network, and a low-power wide area (LPWA) network 862, for example, a LPWA network compatible with the LoRaWan specification promulgated by the LoRa alliance, or a IPv6 over Low Power Wide-Area Networks (LPWAN) network compatible with a specification promulgated by the Internet Engineering Task Force (IETF). Further, the respective IoT networks may communicate with an outside network provider (e.g., a tier 2 or tier 3 provider) using any number of communications links, such as an LTE cellular link, an LPWA link, or a link based on the IEEE 802.15.4 standard, such as Zigbee®. The respective IoT networks may also operate with use of a variety of network and internet application protocols such as Constrained Application Protocol (CoAP). The respective IoT networks may also be integrated with coordinator devices that provide a chain of links that forms cluster tree of linked devices and networks.

Each of these IoT networks may provide opportunities for new technical features, such as those as described herein. The improved technologies and networks may enable the exponential growth of devices and networks, including the use of IoT networks into as fog devices or systems. As the use of such improved technologies grows, the IoT networks may be developed for self-management, functional evolution, and collaboration, without needing direct human intervention. The improved technologies may even enable IoT networks to function without centralized controlled systems. Accordingly, the improved technologies described herein may be used to automate and enhance network management and operation functions far beyond current implementations.

In an example, communications between IoT devices 804, such as over the backbone links 802, may be protected by a decentralized system for authentication, authorization, and accounting (AAA). In a decentralized AAA system, distributed payment, credit, audit, authorization, and authentication systems may be implemented across interconnected heterogeneous network infrastructure. This allows systems and networks to move towards autonomous operations. In these types of autonomous operations, machines may even contract for human resources and negotiate partnerships with other machine networks. This may allow the achievement of mutual objectives and balanced service delivery against outlined, planned service level agreements as well as achieve solutions that provide metering, measurements, traceability and trackability. The creation of new supply chain structures and methods may enable a multitude of services to be created, mined for value, and collapsed without any human involvement.

Such IoT networks may be further enhanced by the integration of sensing technologies, such as sound, light, electronic traffic, facial and pattern recognition, smell, vibration, into the autonomous organizations among the IoT devices. The integration of sensory systems may allow systematic and autonomous communication and coordination of service delivery against contractual service objectives, orchestration and quality of service (QoS) based swarming and fusion of resources. Some of the individual examples of network-based resource processing include the following.

The mesh network 856, for instance, may be enhanced by systems that perform inline data-to-information transforms. For example, self-forming chains of processing resources comprising a multi-link network may distribute the transformation of raw data to information in an efficient manner, and the ability to differentiate between assets and resources and the associated management of each. Furthermore, the proper components of infrastructure and resource based trust and service indices may be inserted to improve the data integrity, quality, assurance and deliver a metric of data confidence.

The WLAN network 858, for instance, may use systems that perform standards conversion to provide multi-standard connectivity, enabling IoT devices 804 using different protocols to communicate. Further systems may provide seamless interconnectivity across a multi-standard infrastructure comprising visible Internet resources and hidden Internet resources.

Communications in the cellular network 860, for instance, may be enhanced by systems that offload data, extend communications to more remote devices, or both. The LPWA network 862 may include systems that perform non-Internet protocol (IP) to IP interconnections, addressing, and routing. Further, each of the IoT devices 804 may include the appropriate transceiver for wide area communications with that device. Further, each IoT device 804 may include other transceivers for communications using additional protocols and frequencies. This is discussed further with respect to the communication environment and hardware of an IoT processing device depicted in FIGS. 10 and 11.

Finally, clusters of IoT devices may be equipped to communicate with other IoT devices as well as with a cloud network. This may allow the IoT devices to form an ad-hoc network between the devices, allowing them to function as a single device, which may be termed a fog device. This configuration is discussed further with respect to FIG. 9 below.

FIG. 9 illustrates a cloud computing network in communication with a mesh network of IoT devices (devices 902) operating as a fog device at the edge of the cloud computing network. The mesh network of IoT devices may be termed a fog 920, operating at the edge of the cloud 900. To simplify the diagram, not every IoT device 902 is labeled.

The fog 920 may be considered to be a massively interconnected network wherein a number of IoT devices 902 are in communications with each other, for example, by radio links 922. As an example, this interconnected network may be facilitated using an interconnect specification released by the Open Connectivity Foundation™ (OCF). This standard allows devices to discover each other and establish communications for interconnects. Other interconnection protocols may also be used, including, for example, the optimized link state routing (OLSR) Protocol, the better approach to mobile ad-hoc networking (B.A.T.M.A.N.) routing protocol, or the OMA Lightweight M2M (LWM2M) protocol, among others.

Three types of IoT devices 902 are shown in this example, gateways 904, data aggregators 926, and sensors 928, although any combinations of IoT devices 902 and functionality may be used. The gateways 904 may be edge devices that provide communications between the cloud 900 and the fog 920, and may also provide the backend process function for data obtained from sensors 928, such as motion data, flow data, temperature data, and the like. The data aggregators 926 may collect data from any number of the sensors 928, and perform the back end processing function for the analysis. The results, raw data, or both may be passed along to the cloud 900 through the gateways 904. The sensors 928 may be full IoT devices 902, for example, capable of both collecting data and processing the data. In some cases, the sensors 928 may be more limited in functionality, for example, collecting the data and allowing the data aggregators 926 or gateways 904 to process the data.

Communications from any IoT device 902 may be passed along a convenient path (e.g., a most convenient path) between any of the IoT devices 902 to reach the gateways 904. In these networks, the number of interconnections provide substantial redundancy, allowing communications to be maintained, even with the loss of a number of IoT devices 902. Further, the use of a mesh network may allow IoT devices 902 that are very low power or located at a distance from infrastructure to be used, as the range to connect to another IoT device 902 may be much less than the range to connect to the gateways 904.

The fog 920 provided from these IoT devices 902 may be presented to devices in the cloud 900, such as a server 906, as a single device located at the edge of the cloud 900, e.g., a fog device. In this example, the alerts coming from the fog device may be sent without being identified as coming from a specific IoT device 902 within the fog 920. In this fashion, the fog 920 may be considered a distributed platform that provides computing and storage resources to perform processing or data-intensive tasks such as data analytics, data aggregation, and machine-learning, among others.

In some examples, the IoT devices 902 may be configured using an imperative programming style, e.g., with each IoT device 902 having a specific function and communication partners. However, the IoT devices 902 forming the fog device may be configured in a declarative programming style, allowing the IoT devices 902 to reconfigure their operations and communications, such as to determine needed resources in response to conditions, queries, and device failures. As an example, a query from a user located at a server 906 about the operations of a subset of equipment monitored by the IoT devices 902 may result in the fog 920 device selecting the IoT devices 902, such as particular sensors 928, needed to answer the query. The data from these sensors 928 may then be aggregated and analyzed by any combination of the sensors 928, data aggregators 926, or gateways 904, before being sent on by the fog 920 device to the server 906 to answer the query. In this example, IoT devices 902 in the fog 920 may select the sensors 928 used based on the query, such as adding data from flow sensors or temperature sensors. Further, if some of the IoT devices 902 are not operational, other IoT devices 902 in the fog 920 device may provide analogous data, if available.

In other examples, the operations and functionality described above may be embodied by a IoT device machine in the example form of an electronic processing system, within which a set or sequence of instructions may be executed to cause the electronic processing system to perform any one of the methodologies discussed herein, according to an example embodiment. The machine may be an IoT device or an IoT gateway, including a machine embodied by aspects of a personal computer (PC), a tablet PC, a personal digital assistant (PDA), a mobile telephone or smartphone, or any machine capable of executing instructions (sequential or otherwise) that specify actions to be taken by that machine. Further, while only a single machine may be depicted and referenced in the example above, such machine shall also be taken to include any collection of machines that individually or jointly execute a set (or multiple sets) of instructions to perform any one or more of the methodologies discussed herein. Further, these and like examples to a processor-based system shall be taken to include any set of one or more machines that are controlled by or operated by a processor (e.g., a computer) to individually or jointly execute instructions to perform any one or more of the methodologies discussed herein.

Figure 10:
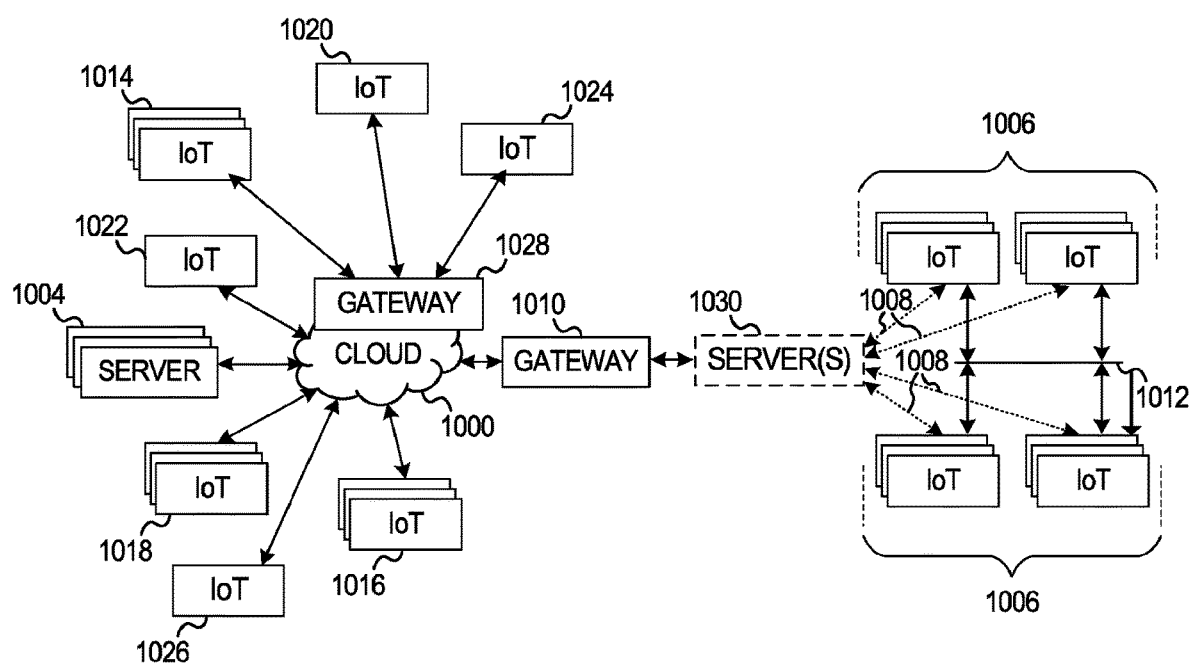
FIG. 10 illustrates a block diagram of a network illustrating communications among a number of IoT devices, according to an example.

FIG. 10 illustrates a drawing of a cloud computing network, or cloud 1000, in communication with a number of Internet of Things (IoT) devices. The cloud 1000 may represent the Internet, or may be a local area network (LAN), or a wide area network (WAN), such as a proprietary network for a company. The IoT devices may include any number of different types of devices, grouped in various combinations. For example, a traffic control group 1006 may include IoT devices along streets in a city. These IoT devices may include stoplights, traffic flow monitors, cameras, weather sensors, and the like. The traffic control group 1006, or other subgroups, may be in communication with the cloud 1000 through wired or wireless links 1008, such as LPWA links, optical links, and the like. Further, a wired or wireless sub-network 1012 may allow the IoT devices to communicate with each other, such as through a local area network, a wireless local area network, and the like. The IoT devices may use another device, such as a gateway 1110 or 1128 to communicate with remote locations such as the cloud 1100; the IoT devices may also use one or more servers 1130 to facilitate communication with the cloud 1100 or with the gateway 1110. For example, the one or more servers 1130 may operate as an intermediate network node to support a local edge cloud or fog implementation among a local area network. Further, the gateway 1128 that is depicted may operate in a cloud-to-gateway-to-many edge devices configuration, such as with the various IoT devices 1114, 1120, 1124 being constrained or dynamic to an assignment and use of resources in the cloud 1100.

Other example groups of IoT devices may include remote weather stations 1014, local information terminals 1016, alarm systems 1018, automated teller machines 1020, alarm panels 1022, or moving vehicles, such as emergency vehicles 1024 or other vehicles 1026, among many others. Each of these IoT devices may be in communication with other IoT devices, with servers 1004, with another IoT fog device or system (not shown, but depicted in FIG. 9), or a combination therein. The groups of IoT devices may be deployed in various residential, commercial, and industrial settings (including in both private or public environments).

As can be seen from FIG. 10, a large number of IoT devices may be communicating through the cloud 1000. This may allow different IoT devices to request or provide information to other devices autonomously. For example, a group of IoT devices (e.g., the traffic control group 1006) may request a current weather forecast from a group of remote weather stations 1014, which may provide the forecast without human intervention. Further, an emergency vehicle 1024 may be alerted by an automated teller machine 1020 that a burglary is in progress. As the emergency vehicle 1024 proceeds towards the automated teller machine 1020, it may access the traffic control group 1006 to request clearance to the location, for example, by lights turning red to block cross traffic at an intersection in sufficient time for the emergency vehicle 1024 to have unimpeded access to the intersection.

Clusters of IoT devices, such as the remote weather stations 1014 or the traffic control group 1006, may be equipped to communicate with other IoT devices as well as with the cloud 1000. This may allow the IoT devices to form an ad-hoc network between the devices, allowing them to function as a single device, which may be termed a fog device or system (e.g., as described above with reference to FIG. 9).

Figure 11:
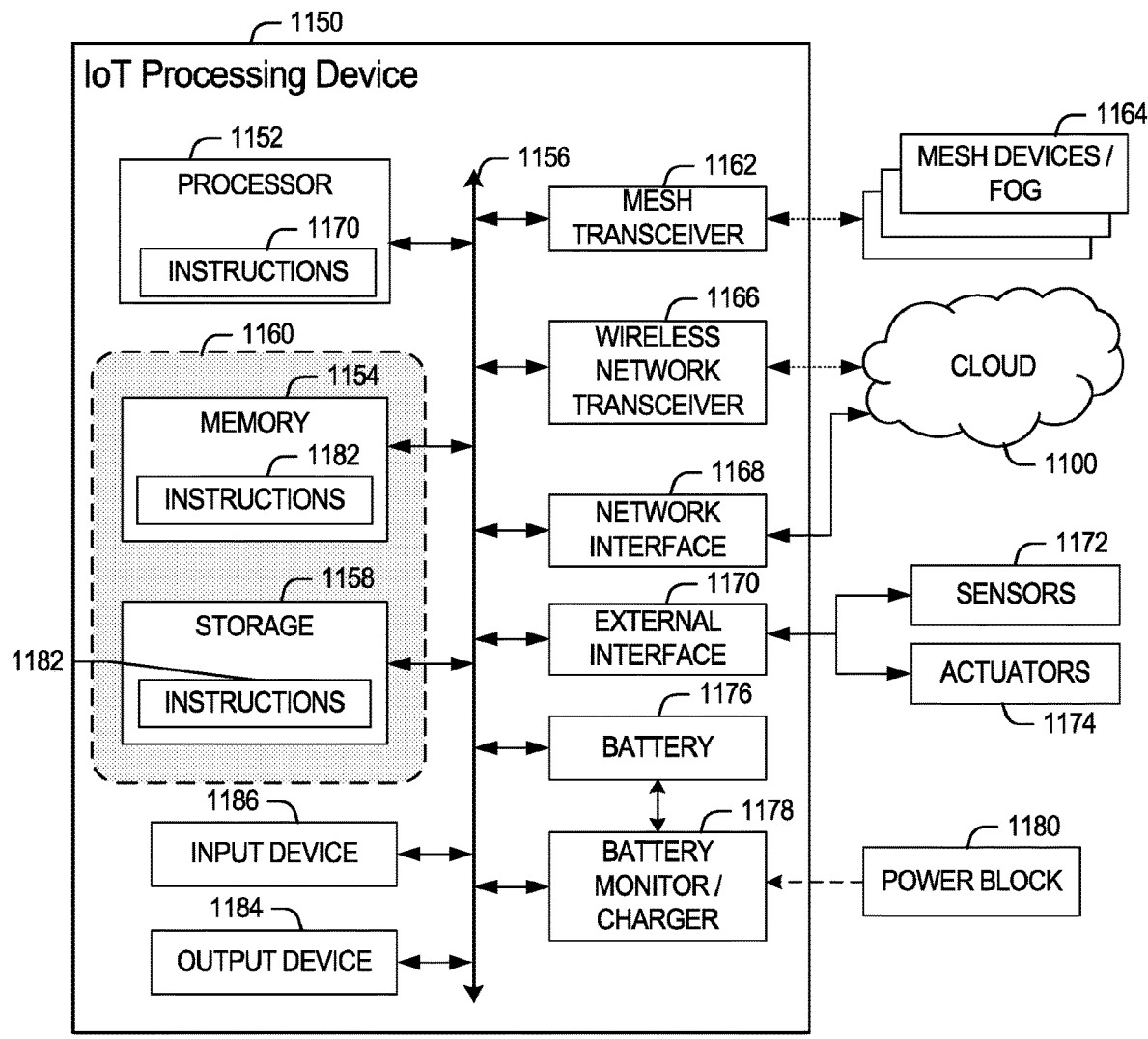
FIG. 11 illustrates a block diagram for an example IoT processing system architecture upon which any one or more of the techniques (e.g., operations, processes, methods, and methodologies) discussed herein may be performed, according to an example.

FIG. 11 is a block diagram of an example of components that may be present in an IoT device 1150 for implementing the techniques described herein. The IoT device 1150 may include any combinations of the components shown in the example or referenced in the disclosure above. The components may be implemented as ICs, portions thereof, discrete electronic devices, or other modules, logic, hardware, software, firmware, or a combination thereof adapted in the IoT device 1150, or as components otherwise incorporated within a chassis of a larger system. Additionally, the block diagram of FIG. 11 is intended to depict a high-level view of components of the IoT device 1150. However, some of the components shown may be omitted, additional components may be present, and different arrangement of the components shown may occur in other implementations.

The IoT device 1150 may include a processor 1152, which may be a microprocessor, a multi-core processor, a multi-threaded processor, an ultra-low voltage processor, an embedded processor, or other known processing element. The processor 1152 may be a part of a system on a chip (SoC) in which the processor 1152 and other components are formed into a single integrated circuit, or a single package, such as the Edison™ or Galileo™ SoC boards from Intel. As an example, the processor 1152 may include an Intel® Architecture Core™ based processor, such as a Quark™, an Atom™, an i3, an i5, an i7, or an MCU-class processor, or another such processor available from Intel® Corporation, Santa Clara, Calif. However, any number other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as an A5-A10 processor from Apple® Inc., a Snapdragon™ processor from Qualcomm® Technologies, Inc., or an OMAP™ processor from Texas Instruments, Inc.

The processor 1152 may communicate with a system memory 1154 over an interconnect 1156 (e.g., a bus). Any number of memory devices may be used to provide for a given amount of system memory. As examples, the memory may be random access memory (RAM) in accordance with a Joint Electron Devices Engineering Council (JEDEC) design such as the DDR or mobile DDR standards (e.g., LPDDR, LPDDR2, LPDDR3, or LPDDR4). In various implementations the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 1158 may also couple to the processor 1152 via the interconnect 1156. In an example the storage 1158 may be implemented via a solid state disk drive (SSDD). Other devices that may be used for the storage 1158 include flash memory cards, such as SD cards, microSD cards, xD picture cards, and the like, and USB flash drives. In low power implementations, the storage 1158 may be on-die memory or registers associated with the processor 1152. However, in some examples, the storage 1158 may be implemented using a micro hard disk drive (HDD). Further, any number of new technologies may be used for the storage 1158 in addition to, or instead of, the technologies described, such resistance change memories, phase change memories, holographic memories, or chemical memories, among others.

The components may communicate over the interconnect 1156. The interconnect 1156 may include any number of technologies, including industry standard architecture (ISA), extended ISA (EISA), peripheral component interconnect (PCI), peripheral component interconnect extended (PCIx), PCI express (PCIe), or any number of other technologies. The interconnect 1156 may be a proprietary bus, for example, used in a SoC based system. Other bus systems may be included, such as an I2C interface, an SPI interface, point to point interfaces, and a power bus, among others.

The interconnect 1156 may couple the processor 1152 to a mesh transceiver 1162, for communications with other mesh devices 1164. The mesh transceiver 1162 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the mesh devices 1164. For example, a WLAN unit may be used to implement Wi-Fi™ communications in accordance with the Institute of Electrical and Electronics Engineers (IEEE) 802.11 standard. In addition, wireless wide area communications, e.g., according to a cellular or other wireless wide area protocol, may occur via a WWAN unit.

The mesh transceiver 1162 may communicate using multiple standards or radios for communications at different range. For example, the IoT device 1150 may communicate with close devices, e.g., within about 10 meters, using a local transceiver based on BLE, or another low power radio, to save power. More distant mesh devices 1164, e.g., within about 50 meters, may be reached over ZigBee or other intermediate power radios. Both communications techniques may take place over a single radio at different power levels, or may take place over separate transceivers, for example, a local transceiver using BLE and a separate mesh transceiver using ZigBee.

A wireless network transceiver 1166 may be included to communicate with devices or services in the cloud 1100 via local or wide area network protocols. The wireless network transceiver 1166 may be a LPWA transceiver that follows the IEEE 802.15.4, or IEEE 802.15.4g standards, among others. The IoT device 1150 may communicate over a wide area using LoRaWAN™ (Long Range Wide Area Network) developed by Semtech and the LoRa Alliance. The techniques described herein are not limited to these technologies, but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the mesh transceiver 1162 and wireless network transceiver 1166, as described herein. For example, the radio transceivers 1162 and 1166 may include an LTE or other cellular transceiver that uses spread spectrum (SPA/SAS) communications for implementing high speed communications. Further, any number of other protocols may be used, such as Wi-Fi® networks for medium speed communications and provision of network communications.

The radio transceivers 1162 and 1166 may include radios that are compatible with any number of 3GPP (Third Generation Partnership Project) specifications, notably Long Term Evolution (LTE), Long Term Evolution-Advanced (LTE-A), and Long Term Evolution-Advanced Pro (LTE-A Pro). It can be noted that radios compatible with any number of other fixed, mobile, or satellite communication technologies and standards may be selected. These may include, for example, any Cellular Wide Area radio communication technology, which may include e.g. a 5th Generation (5G) communication systems, a Global System for Mobile Communications (GSM) radio communication technology, a General Packet Radio Service (GPRS) radio communication technology, or an Enhanced Data Rates for GSM Evolution (EDGE) radio communication technology, a UMTS (Universal Mobile Telecommunications System) communication technology, In addition to the standards listed above, any number of satellite uplink technologies may be used for the wireless network transceiver 1166, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated.

A network interface controller (NIC) 1168 may be included to provide a wired communication to the cloud 1100 or to other devices, such as the mesh devices 1164. The wired communication may provide an Ethernet connection, or may be based on other types of networks, such as Controller Area Network (CAN), Local Interconnect Network (LIN), DeviceNet, ControlNet, Data Highway+, PROFIBUS, or PROFINET, among many others. An additional NIC 1168 may be included to allow connect to a second network, for example, a NIC 1168 providing communications to the cloud over Ethernet, and a second NIC 1168 providing communications to other devices over another type of network.

The interconnect 1156 may couple the processor 1152 to an external interface 1170 that is used to connect external devices or subsystems. The external devices may include sensors 1172, such as accelerometers, level sensors, flow sensors, optical light sensors, camera sensors, temperature sensors, a global positioning system (GPS) sensors, pressure sensors, barometric pressure sensors, and the like. The external interface 1170 further may be used to connect the IoT device 1150 to actuators 1174, such as power switches, valve actuators, an audible sound generator, a visual warning device, and the like.

In some optional examples, various input/output (I/O) devices may be present within, or connected to, the IoT device 1150. For example, a display or other output device 1184 may be included to show information, such as sensor readings or actuator position. An input device 1186, such as a touch screen or keypad may be included to accept input. An output device 1184 may include any number of forms of audio or visual display, including simple visual outputs such as binary status indicators (e.g., LEDs) and multi-character visual outputs, or more complex outputs such as display screens (e.g., LCD screens), with the output of characters, graphics, multimedia objects, and the like being generated or produced from the operation of the IoT device 1150.

A battery 1176 may power the IoT device 1150, although in examples in which the IoT device 1150 is mounted in a fixed location, it may have a power supply coupled to an electrical grid. The battery 1176 may be a lithium ion battery, or a metal-air battery, such as a zinc-air battery, an aluminum-air battery, a lithium-air battery, and the like.

A battery monitor/charger 1178 may be included in the IoT device 1150 to track the state of charge (SoCh) of the battery 1176. The battery monitor/charger 1178 may be used to monitor other parameters of the battery 1176 to provide failure predictions, such as the state of health (SoH) and the state of function (SoF) of the battery 1176. The battery monitor/charger 1178 may include a battery monitoring integrated circuit, such as an LTC4020 or an LTC2990 from Linear Technologies, an ADT7488A from ON Semiconductor of Phoenix Ariz., or an IC from the UCD90xxx family from Texas Instruments of Dallas, Tex. The battery monitor/charger 1178 may communicate the information on the battery 1176 to the processor 1152 over the interconnect 1156. The battery monitor/charger 1178 may also include an analog-to-digital (ADC) convertor that allows the processor 1152 to directly monitor the voltage of the battery 1176 or the current flow from the battery 1176. The battery parameters may be used to determine actions that the IoT device 1150 may perform, such as transmission frequency, mesh network operation, sensing frequency, and the like.

A power block 1180, or other power supply coupled to a grid, may be coupled with the battery monitor/charger 1178 to charge the battery 1176. In some examples, the power block 1180 may be replaced with a wireless power receiver to obtain the power wirelessly, for example, through a loop antenna in the IoT device 1150. A wireless battery charging circuit, such as an LTC4020 chip from Linear Technologies of Milpitas, Calif., among others, may be included in the battery monitor/charger 1178. The specific charging circuits chosen depend on the size of the battery 1176, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 1158 may include instructions 1182 in the form of software, firmware, or hardware commands to implement the techniques described herein. Although such instructions 1182 are shown as code blocks included in the memory 1154 and the storage 1158, it may be understood that any of the code blocks may be replaced with hardwired circuits, for example, built into an application specific integrated circuit (ASIC).

In an example, the instructions 1182 provided via the memory 1154, the storage 1158, or the processor 1152 may be embodied as a non-transitory, machine readable medium 1160 including code to direct the processor 1152 to perform electronic operations in the IoT device 1150. The processor 1152 may access the non-transitory, machine readable medium 1160 over the interconnect 1156. For instance, the non-transitory, machine readable medium 1160 may be embodied by devices described for the storage 1158 of FIG. 11 or may include specific storage units such as optical disks, flash drives, or any number of other hardware devices. The non-transitory, machine readable medium 1160 may include instructions to direct the processor 1152 to perform a specific sequence or flow of actions, for example, as described with respect to the flowchart(s) and block diagram(s) of operations and functionality depicted above.

In further examples, a machine-readable medium also includes any tangible medium that is capable of storing, encoding or carrying instructions for execution by a machine and that cause the machine to perform any one or more of the methodologies of the present disclosure or that is capable of storing, encoding or carrying data structures utilized by or associated with such instructions. A "machine-readable medium" thus may include, but is not limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks. The instructions embodied by a machine-readable medium may further be transmitted or received over a communications network using a transmission medium via a network interface device utilizing any one of a number of transfer protocols (e.g., HTTP).

It should be understood that the functional units or capabilities described in this specification may have been referred to or labeled as components or modules, in order to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together, but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules, and may be embodied in any suitable form and organized within any suitable type of data structure. The operational data may be collected as a single data set, or may be distributed over different locations including over different storage devices, and may exist, at least partially, merely as electronic signals on a system or network. The components or modules may be passive or active, including agents operable to perform desired functions.

EXAMPLES

Illustrative examples of the technologies disclosed herein are provided below. An embodiment of the technologies may include any one or more, and any combination of, the examples described below.

Example 1 includes an endpoint computing device for applying a redundancy encoding scheme to segmented portions of a data block, the endpoint computing device comprising a data block segmentation manager to divide a block of data into a plurality of data segments as a function of a transmit window size and a redundancy encoding scheme; generate redundant data for each of the plurality of data segments based on the redundancy encoding scheme, wherein the redundant data is usable to reconstruct each of the plurality of data segments; and format a series of network packets, wherein each formatted network packet of the series of network packets includes (i) a data segment of the plurality of data segments and (ii) generated redundant data for at least one other data segment of the plurality of data segments, and a network traffic ingress/egress manager to transmit each of the series of network packets to a destination computing device.

Example 2 includes the subject matter of Example 1, and wherein to generate the redundant data comprises to encode each of the plurality of data segments using an erasure encoding scheme.

Example 3 includes the subject matter of any of Examples 1 and 2, and wherein to encode each of the plurality of data segments using the erasure encoding scheme includes to encode the redundant data based on a quality level of a transmission signal between the endpoint computing device and the destination computing device.

Example 4 includes the subject matter of any of Examples 1-3, and wherein to encode each of the plurality of data segments using the erasure encoding scheme includes to encode the redundant data based on one or more upper-level protocols.

Example 5 includes the subject matter of any of Examples 1-4, and wherein to encode each of the plurality of data segments using the erasure encoding scheme includes to encode the redundant data based on one or more missing or updated transmission routes between the endpoint computing device and the destination computing device.

Example 6 includes the subject matter of any of Examples 1-5, and wherein to generate the redundant data comprises to apply a logical operation to one or more of the plurality of data segments to generate parity data usable to generate one or more of the plurality of data segments.

Example 7 includes the subject matter of any of Examples 1-6, and wherein the logical operation comprises an XOR or an XNOR operation.

Example 8 includes the subject matter of any of Examples 1-7, and wherein to generate the redundant data comprises to generate the redundant data during a segmentation offload operation.

Example 9 includes the subject matter of any of Examples 1-8, and wherein the data block segmentation manager is further to determine the transmit window size at least in part on one or more conditions of a network communicatively coupling the endpoint computing device and the destination computing device.

Example 10 includes the subject matter of any of Examples 1-9, and wherein to transmit each of the series of network packets to a destination computing device comprises to transmit a first subset of the network packets in a first packet burst, a second subset of the network packets in a second packet burst, and a third subset of the network packets in a third burst, and wherein the redundant data of at least one network packet of the second subset of the network packets includes redundant data for at least one data segment in the third subset of the network packets.

Example 11 includes the subject matter of any of Examples 1-10, and wherein the redundant data of at least one network packet of the second subset of the network packets includes redundant data for at least one data segment in the first subset of the network packets.

Example 12 includes a method for applying a redundancy encoding scheme to segmented portions of a data block, the method comprising dividing, by an endpoint computing device, a block of data into a plurality of data segments as a function of a transmit window size and a redundancy encoding scheme; generating, by the endpoint computing device, redundant data for each of the plurality of data segments based on the redundancy encoding scheme, wherein the redundant data is usable to reconstruct each of the plurality of data segments; formatting, by the endpoint computing device, a series of network packets, wherein each formatted network packet of the series of network packets includes (i) a data segment of the plurality of data segments and (ii) generated redundant data for at least one other data segment of the plurality of data segments; and transmitting, by the endpoint computing device, each of the series of network packets to a destination computing device.

Example 13 includes the subject matter of Example 12, and wherein generating the redundant data comprises encoding each of the plurality of data segments using an erasure encoding scheme.

Example 14 includes the subject matter of any of Examples 12 and 13, and wherein encoding each of the plurality of data segments using the erasure encoding scheme includes to encode the redundant data based on a quality level of a transmission signal between the endpoint computing device and the destination computing device.

Example 15 includes the subject matter of any of Examples 12-14, and wherein encoding each of the plurality of data segments using the erasure encoding scheme includes encoding the redundant data based on one or more upper-level protocols.

Example 16 includes the subject matter of any of Examples 12-15, and wherein encoding each of the plurality of data segments using the erasure encoding scheme includes encoding the redundant data based on one or more missing or updated transmission routes between the endpoint computing device and the destination computing device.

Example 17 includes the subject matter of any of Examples 12-16, and wherein generating the redundant data comprises applying a logical operation to one or more of the plurality of data segments to generate parity data usable to generate one or more of the plurality of data segments.

Example 18 includes the subject matter of any of Examples 12-17, and wherein applying the logical operation comprises applying an XOR or an XNOR operation.

Example 19 includes the subject matter of any of Examples 12-18, and wherein generating the redundant data comprises generating the redundant data during a segmentation offload operation.

Example 20 includes the subject matter of any of Examples 12-19, and further comprising determining, by the endpoint computing device, the transmit window size at least in part on one or more conditions of a network communicatively coupling the endpoint computing device and the destination computing device.

Example 21 includes the subject matter of any of Examples 12-20, and wherein transmitting each of the series of network packets to a destination computing device comprises transmitting a first subset of the network packets in a first packet burst, a second subset of the network packets in a second packet burst, and a third subset of the network packets in a third burst, and wherein the redundant data of at least one network packet of the second subset of the network packets includes redundant data for at least one data segment in the third subset of the network packets.

Example 22 includes the subject matter of any of Examples 12-21, and wherein the redundant data of at least one network packet of the second subset of the network packets includes redundant data for at least one data segment in the first subset of the network packets.

Example 23 includes one or more machine-readable storage media comprising a plurality of instructions stored thereon that, when executed, cause an endpoint computing device to perform the method of any of Examples 12-22.

Example 24 includes an endpoint computing device for applying a redundancy encoding scheme to segmented portions of a data block, the endpoint computing device comprising means for performing the method of any of Examples 12-22.

Example 25 includes an endpoint computing device for applying a redundancy encoding scheme to segmented portions of a data block, the endpoint computing device comprising means for dividing a block of data into a plurality of data segments as a function of a transmit window size and a redundancy encoding scheme; means for generating redundant data for each of the plurality of data segments based on the redundancy encoding scheme, wherein the redundant data is usable to reconstruct each of the plurality of data segments; and means for formatting a series of network packets, wherein each formatted network packet of the series of network packets includes (i) a data segment of the plurality of data segments and (ii) generated redundant data for at least one other data segment of the plurality of data segments, and means for transmitting each of the series of network packets to a destination computing device.

Example 26 includes the subject matter of Example 25, and wherein the means for generating the redundant data comprises means for encoding each of the plurality of data segments using an erasure encoding scheme.

Example 27 includes the subject matter of any of Examples 25 and 26, and wherein the means for encoding each of the plurality of data segments using the erasure encoding scheme includes to encode the redundant data based on a quality level of a transmission signal between the endpoint computing device and the destination computing device.

Example 28 includes the subject matter of any of Examples 25-27, and wherein the means for encoding each of the plurality of data segments using the erasure encoding scheme includes means for encoding the redundant data based on one or more upper-level protocols.

Example 29 includes the subject matter of any of Examples 25-28, and wherein the means for encoding each of the plurality of data segments using the erasure encoding scheme includes means for encoding the redundant data based on one or more missing or updated transmission routes between the endpoint computing device and the destination computing device.

Example 30 includes the subject matter of any of Examples 25-29, and wherein the means for generating the redundant data comprises means for applying a logical operation to one or more of the plurality of data segments to generate parity data usable to generate one or more of the plurality of data segments.

Example 31 includes the subject matter of any of Examples 25-30, and wherein the logical operation comprises an XOR or an XNOR operation.

Example 32 includes the subject matter of any of Examples 25-31, and wherein the means for generating the redundant data comprises means for generating the redundant data during a segmentation offload operation.

Example 33 includes the subject matter of any of Examples 25-32, and further comprising means for determining the transmit window size at least in part on one or more conditions of a network communicatively coupling the endpoint computing device and the destination computing device.

Example 34 includes the subject matter of any of Examples 25-33, and wherein the means for transmitting each of the series of network packets to a destination computing device comprises means for transmitting a first subset of the network packets in a first packet burst, a second subset of the network packets in a second packet burst, and a third subset of the network packets in a third burst, and wherein the redundant data of at least one network packet of the second subset of the network packets includes redundant data for at least one data segment in the third subset of the network packets.

Example 35 includes the subject matter of any of Examples 25-34, and wherein the redundant data of at least one network packet of the second subset of the network packets includes redundant data for at least one data segment in the first subset of the network packets.

Example 36 includes a network computing device for applying a redundancy encoding scheme to segmented portions of a data block, the network computing device comprising a network traffic ingress/egress manager to receive a network packet of a series of network packets, wherein each network packet of the series of network packets includes a segment of a data block and redundant data; and extract and buffer (i) a data block segment and (ii) redundant data of the received network packet, and a data block reconstruction manager to determine whether to reconstruct another data block segment associated with another network packet of the series of network packets; and reconstruct the other data block segment based at least in part on the redundant data of the received network packet.

Example 37 includes the subject matter of Example 36, and wherein the data block reconstruction manager is further to identify, in response to having determined to reconstruct the other data block segment, one or more other network packets of the series of network packets required to reconstruct the other data block segment; and reconstruct the other data block segment in response to having identified and received the one or more other network packets of the series of network packets required to reconstruct the other data block segment.

Example 38 includes the subject matter of any of Examples 36 and 37, and wherein to reconstruct the other data block segment comprises to reconstruct the other data block segment based on an erasure encoding scheme used to generate the redundant data.

Example 39 includes the subject matter of any of Examples 36-38, and wherein to reconstruct the other data block segment comprises to reconstruct the other data block segment based on a hash function.

Example 40 includes the subject matter of any of Examples 36-39, and wherein the data block reconstruction manager is further to determine whether all data block segments of the series of network packets have either been received or reconstructed; and construct the data block from each of the data block segments of the series of network packets which have either been received or reconstructed.

Example 41 includes a method for applying a redundancy encoding scheme to segmented portions of a data block, the method comprising receiving, by a network computing device, a network packet of a series of network packets, wherein each network packet of the series of network packets includes a segment of a data block and redundant data; extracting and buffering, by the network computing device, (i) a data block segment of the received network packet and (ii) redundant data of the received network packet; determining, by the network computing device, whether to reconstruct another data block segment associated with another network packet of the series of network packets; and reconstructing, by the network computing device, the other data block segment based at least in part on the redundant data of the received network packet.

Example 42 includes the subject matter of Example 41, and identifying, by the network computing device and in response to having determined to reconstruct the other data block segment, one or more other network packets of the series of network packets required to reconstruct the other data block segment; and reconstructing, by the network computing device, the other data block segment in response to having identified and received the one or more other network packets of the series of network packets required to reconstruct the other data block segment.

Example 43 includes the subject matter of any of Examples 41 and 42, and wherein reconstructing the other data block segment comprises reconstructing the other data block segment based on an erasure encoding scheme used to generate the redundant data.

Example 44 includes the subject matter of any of Examples 40-43, and wherein to reconstructing the other data block segment comprises reconstructing the other data block segment based on a hash function.

Example 45 includes the subject matter of any of Examples 40-44, and further comprising determining, by the network computing device, whether all data block segments of the series of network packets have either been received or reconstructed; and constructing, by the network computing device, the data block from each of the data block segments of the series of network packets which have either been received or reconstructed.

Example 46 includes one or more machine-readable storage media comprising a plurality of instructions stored thereon that, when executed, cause a network computing device to perform the method of any of Examples 41-45.

Example 47 includes a network computing device for applying a redundancy encoding scheme to segmented portions of a data block, the network computing device comprising means for performing the method of any of Examples 41-45.

Example 48 includes a network computing device for applying a redundancy encoding scheme to segmented portions of a data block, the network computing device comprising means for receiving a network packet of a series of network packets, wherein each network packet of the series of network packets includes a segment of a data block and redundant data; and means for extracting and buffering (i) a data block segment and (ii) redundant data of the received network packet; means for determining whether to reconstruct another data block segment associated with another network packet of the series of network packets; and means for reconstructing the other data block segment based at least in part on the redundant data of the received network packet.

Example 49 includes the subject matter of Example 48, and further comprising means for identifying, in response to having determined to reconstruct the other data block segment, one or more other network packets of the series of network packets required to reconstruct the other data block segment; and means for reconstructing the other data block segment in response to having identified and received the one or more other network packets of the series of network packets required to reconstruct the other data block segment.

Example 50 includes the subject matter of any of Examples 48 and 49, and wherein the means for reconstructing the other data block segment comprises means for reconstructing the other data block segment based on an erasure encoding scheme used to generate the redundant data.

Example 51 includes the subject matter of any of Examples 48-50, and wherein the means for reconstructing the other data block segment comprises means for reconstructing the other data block segment based on a hash function.

Example 52 includes the subject matter of any of Examples 48-51, and further comprising means for determining whether all data block segments of the series of network packets have either been received or reconstructed; and means for constructing the data block from each of the data block segments of the series of network packets which have either been received or reconstructed.

The invention claimed is:

1. A network computing device for applying a redundancy encoding scheme to segmented portions of a data block, the network computing device comprising:
   a network traffic ingress/egress manager to receive a network packet of a series of network packets, wherein each network packet of the series of network packets includes a segment of a data block and redundant data, wherein the network traffic ingress/egress manager is to extract and buffer (i) a data block segment and (ii) redundant data of the received network packet; and
   a data block reconstruction manager to determine whether to (i) reconstruct another data block segment associated with another network packet of the series of network packets and (ii) reconstruct the other data block segment based at least in part on the redundant data of the received network packet.

2. The network computing device of claim 1, wherein the data block reconstruction manager is further to identify, in response to having determined to reconstruct the other data block segment, one or more other network packets of the series of network packets required to reconstruct the other data block segment; and reconstruct the other data block segment in response to having identified and received the one or more other network packets of the series of network packets required to reconstruct the other data block segment.

3. The network computing device of claim 1, wherein the data block reconstruction manager is further to identify, in response to having determined to reconstruct the other data block segment, one or more other network packets of the series of network packets required to reconstruct the other data block segment based on metadata in a header of one or more data packets; and reconstruct the other data block segment in response to having identified and received the one or more other network packets of the series of network packets required to reconstruct the other data block segment.

4. The network computing device of claim 1, wherein to reconstruct the other data block segment includes to reconstruct the other data block segment based on an erasure encoding scheme used to generate the redundant data.

5. The network computing device of claim 1 wherein to reconstruct the other data block segment includes to reconstruct the other data block segment based on a hash function.

6. The network computing device of claim 1, wherein the data block reconstruction manager is further to determine whether all data block segments of the series of network packets have either been received or reconstructed; and construct the data block from each of the data block segments of the series of network packets which have either been received or reconstructed.

7. A method for applying a redundancy encoding scheme to segmented portions of a data block, the method comprising:
receiving, by a network computing device, a network packet of a series of network packets, wherein each network packet of the series of network packets includes a segment of a data block and redundant data;
extracting and buffering, by the network computing device, (i) a data block segment of the received network packet and (ii) redundant data of the received network packet;
determining, by the network computing device, whether to reconstruct another data block segment associated with another network packet of the series of network packets; and
reconstructing, by the network computing device, the other data block segment based at least in part on the redundant data of the received network packet.

8. The method of claim 7, further including identifying, by the network computing device and in response to having determined to reconstruct the other data block segment, one or more other network packets of the series of network packets required to reconstruct the other data block segment; and reconstructing, by the network computing device, the other data block segment in response to having identified and received the one or more other network packets of the series of network packets required to reconstruct the other data block segment.

9. The method of claim 7, further including identifying, by the network computing device, and in response to having determined to reconstruct the other data block segment, one or more other network packets of the series of network packets required to reconstruct the other data block segment based on metadata in a header of one or more data packets; and reconstruct, by the network computing device, the other data block segment in response to having identified and received the one or more other network packets of the series of network packets required to reconstruct the other data block segment.

10. The method of claim 7, wherein reconstructing the other data block segment includes reconstructing the other data block segment based on an erasure encoding scheme used to generate the redundant data.

11. The method of claim 7, wherein reconstructing the other data block segment includes reconstructing the other data block segment based on a hash function.

12. The method of claim 7, further including determining, by the network computing device, whether all data block segments of the series of network packets have either been received or reconstructed; and constructing, by the network computing device, the data block from each of the data block segments of the series of network packets which have either been received or reconstructed.

13. One or more computer-readable storage media comprising a plurality of instructions stored thereon that, in response to being executed, cause a network computing device to:
receive a network packet of a series of network packets, wherein each network packet of the series of network packets includes a segment of a data block and redundant data;
extract and buffer: (i) a data block segment of the received network packet and (ii) redundant data of the received network packet;
determine whether to reconstruct another data block segment associated with another network packet of the series of network packets; and
reconstruct the other data block segment based at least in part on the redundant data of the received network packet.

14. The one or more computer-readable storage media of claim 13, further including one or more instructions to identify, by the network computing device and in response to having determined to reconstruct the other data block segment, one or more other network packets of the series of network packets required to reconstruct the other data block segment; and reconstruct, by the network computing device, the other data block segment in response to having identified and received the one or more other network packets of the series of network packets required to reconstruct the other data block segment.

15. The one or more computer-readable storage media of claim 13, further including one or more instructions to identify, by the network computing device, and in response to having determined to reconstruct the other data block segment, one or more other network packets of the series of network packets required to reconstruct the other data block segment based on metadata in a header of one or more data packets; and reconstruct, by the network computing device, the other data block segment in response to having identified and received the one or more other network packets of the series of network packets required to reconstruct the other data block segment.

16. The one or more computer-readable storage media of claim 13, wherein to reconstruct the other data block segment includes reconstructing the other data block segment based on an erasure encoding scheme used to generate the redundant data.

17. The one or more computer-readable storage media of claim 13, wherein to reconstruct the other data block segment includes reconstructing the other data block segment based on a hash function.

18. The one or more computer-readable storage media of claim 13, further including one or more instructions to determine whether all data block segments of the series of network packets have either been received or reconstructed; and construct, by the network computing device, the data block from each of the data block segments of the series of network packets which have either been received or reconstructed.

19. An apparatus, comprising:
  at least one memory;
  instructions in the apparatus; and
  processor circuitry to execute the instructions to:
    receive a network packet of a series of network packets, wherein each network packet of the series of network packets includes a segment of a data block and redundant data;
    extract and buffer: (i) a data block segment of the received network packet and (ii) redundant data of the received network packet;
    determine whether to reconstruct another data block segment associated with another network packet of the series of network packets; and
    reconstruct the other data block segment based at least in part on the redundant data of the received network packet.

20. The apparatus of claim 19, wherein the processor circuitry is to identify, in response to having determined to reconstruct the other data block segment, one or more other network packets of the series of network packets required to reconstruct the other data block segment; and reconstruct the other data block segment in response to having identified and received the one or more other network packets of the series of network packets required to reconstruct the other data block segment.

21. The apparatus of claim 19, wherein the processor circuitry is to identify, in response to having determined to reconstruct the other data block segment, one or more other network packets of the series of network packets required to reconstruct the other data block segment based on metadata in a header of one or more data packets; and reconstruct the other data block segment in response to having identified and received the one or more other network packets of the series of network packets required to reconstruct the other data block segment.

22. The apparatus of claim 19, wherein the processor circuitry is to reconstruct the other data block segment based on an erasure encoding scheme used to generate the redundant data.

23. The apparatus of claim 19, wherein the processor circuitry is to reconstruct the other data block segment based on a hash function.

24. The apparatus of claim 19, wherein the processor circuitry is to determine whether all data block segments of the series of network packets have either been received or reconstructed; and construct the data block from each of the data block segments of the series of network packets which have either been received or reconstructed.

* * * * *